United States Patent
Cho et al.

(10) Patent No.: US 10,825,862 B2
(45) Date of Patent: Nov. 3, 2020

(54) VARIABLE RESISTANCE MEMORY DEVICE

(71) Applicant: SAMSUNG ELECTRONICS CO., LTD., Suwon-si (KR)

(72) Inventors: Junghyun Cho, Anyang-si (KR); You-Jin Jung, Hwaseong-si (KR); Masayuki Terai, Suwon-si (KR); Jinchan Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/394,139

(22) Filed: Apr. 25, 2019

(65) Prior Publication Data
US 2020/0111835 A1    Apr. 9, 2020

(30) Foreign Application Priority Data
Oct. 5, 2018 (KR) .......... 10-2018-0119098

(51) Int. Cl.
*H01L 27/24* (2006.01)
*H01L 45/00* (2006.01)

(52) U.S. Cl.
CPC .......... *H01L 27/2427* (2013.01); *H01L 45/06* (2013.01); *H01L 45/1233* (2013.01); *H01L 45/1253* (2013.01); *H01L 45/143* (2013.01); *H01L 45/144* (2013.01); *H01L 45/1683* (2013.01)

(58) Field of Classification Search
CPC ............ H01L 27/2427; H01L 45/1683; H01L 45/144; H01L 45/143; H01L 45/1253; H01L 45/1233; H01L 45/06
See application file for complete search history.

(56) References Cited

U.S. PATENT DOCUMENTS

| | | | |
|---|---|---|---|
| 7,671,353 B2 | 3/2010 | Philipp et al. |
| 7,679,075 B2 | 3/2010 | Chao |
| 7,772,583 B2 | 8/2010 | Liu |
| 7,920,414 B2 | 4/2011 | Lowrey |
| 8,440,991 B2 | 5/2013 | Park et al. |
| 8,565,039 B2 | 10/2013 | Lambertson et al. |
| 9,478,281 B2 | 10/2016 | Son |
| 9,590,014 B2 | 3/2017 | Joshi et al. |

(Continued)

FOREIGN PATENT DOCUMENTS

KR    10-1776858 B1    9/2017

*Primary Examiner* — Karen Kusumakar
(74) *Attorney, Agent, or Firm* — Sughrue Mion, PLLC

(57) ABSTRACT

A variable resistance memory device includes: a substrate including a peripheral region and a core region, the core region including a far region spaced apart from the peripheral region and a near region between the far region and the peripheral region; first conductive lines disposed on the substrate and extending in a first direction; second conductive lines disposed on the first conductive lines and extending in a second direction intersecting the first direction, and memory cells disposed between the first and second conductive lines on the core region. The memory cells include a near memory cell disposed on the near region, and a far memory cell disposed on the far region, wherein a resistance or threshold voltage of the near memory cell, controlling connection of each of the memory cells to a corresponding one of the second conductive lines, is different from that of the far memory cell.

19 Claims, 23 Drawing Sheets

(56) References Cited

U.S. PATENT DOCUMENTS

| | | | |
|---|---|---|---|
| 9,640,588 B2 | 5/2017 | Sciarrillo et al. | |
| 9,666,798 B1 | 5/2017 | Lee | |
| 9,734,907 B2 | 8/2017 | Kau et al. | |
| 9,767,901 B1 | 9/2017 | Sharma et al. | |
| 9,837,471 B2 | 12/2017 | Shepard et al. | |
| 9,935,154 B2 | 4/2018 | Pellizzer et al. | |
| 9,991,315 B2 | 6/2018 | Terai et al. | |
| 2010/0072453 A1 | 3/2010 | Jeong et al. | |
| 2010/0110770 A1* | 5/2010 | Kim | G11C 5/025 365/148 |
| 2011/0095255 A1* | 4/2011 | Sumino | H01L 45/145 257/2 |
| 2013/0181183 A1* | 7/2013 | Pellizzer | H04L 45/06 257/5 |
| 2015/0171321 A1 | 6/2015 | Chan et al. | |
| 2017/0294483 A1 | 10/2017 | Terai et al. | |
| 2017/0309683 A1 | 10/2017 | Sim et al. | |
| 2017/0372779 A1 | 12/2017 | O'Toole et al. | |
| 2018/0047784 A1 | 2/2018 | Ohba et al. | |

* cited by examiner

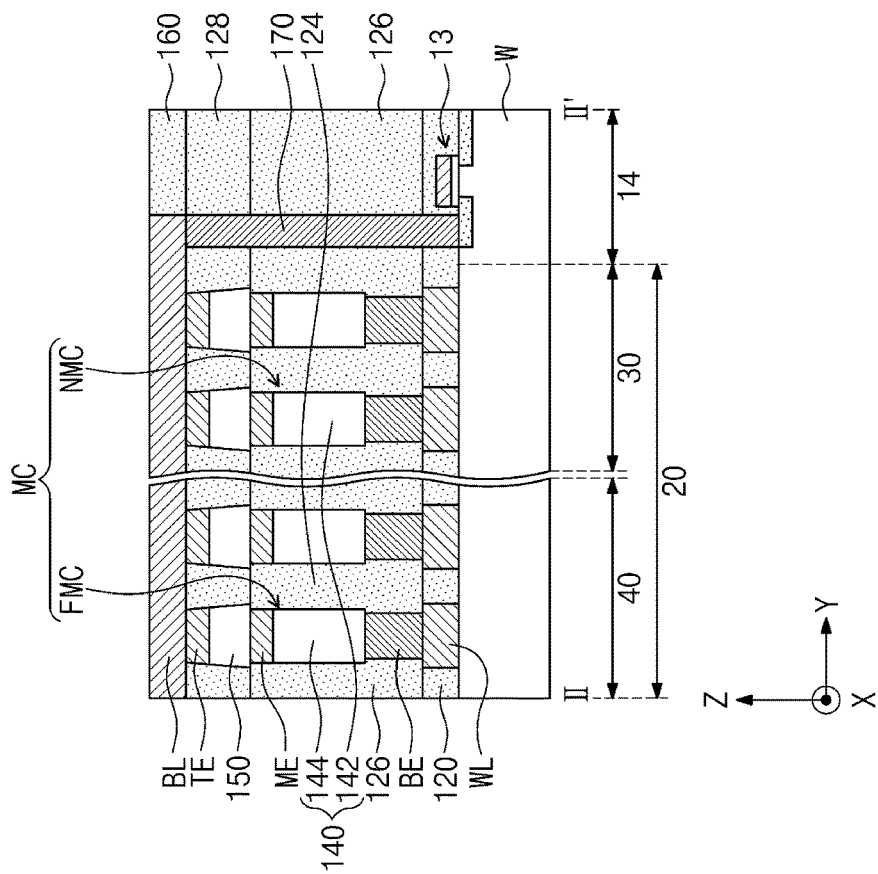
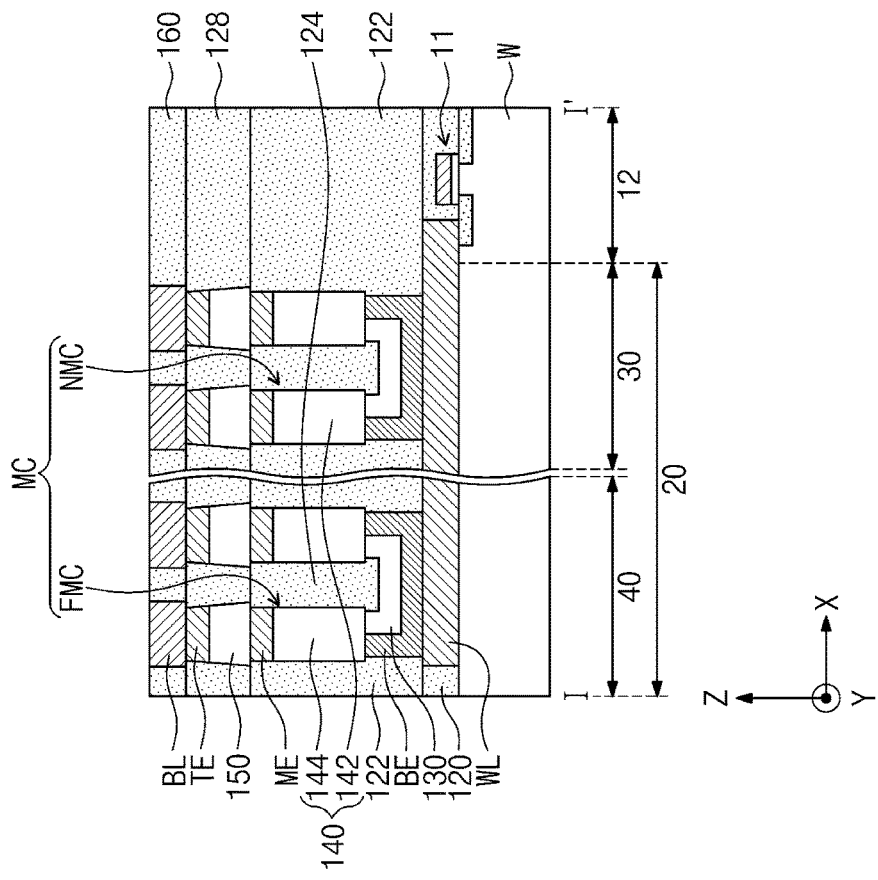

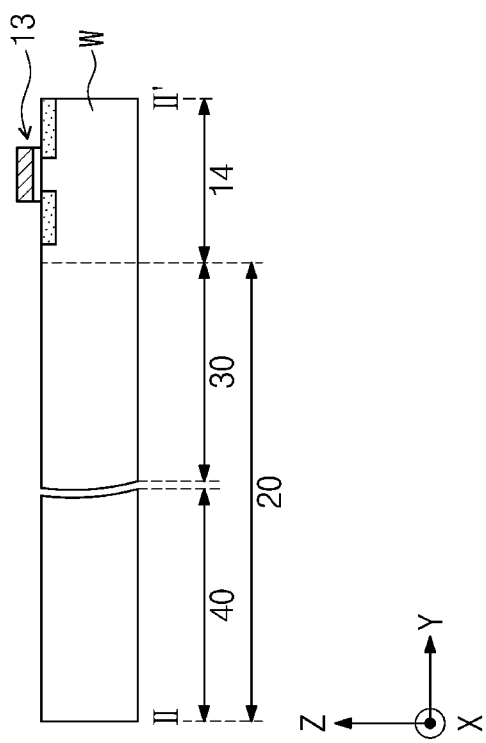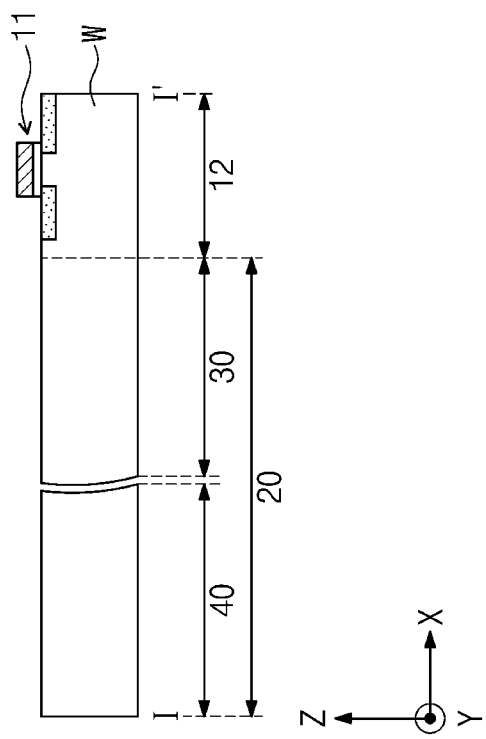

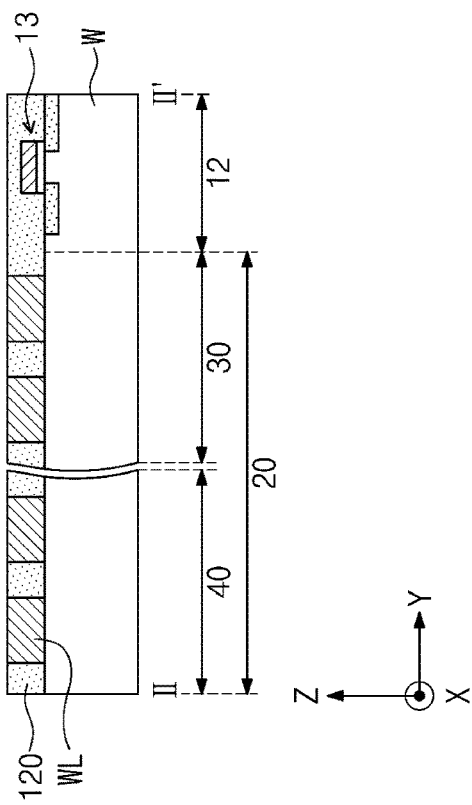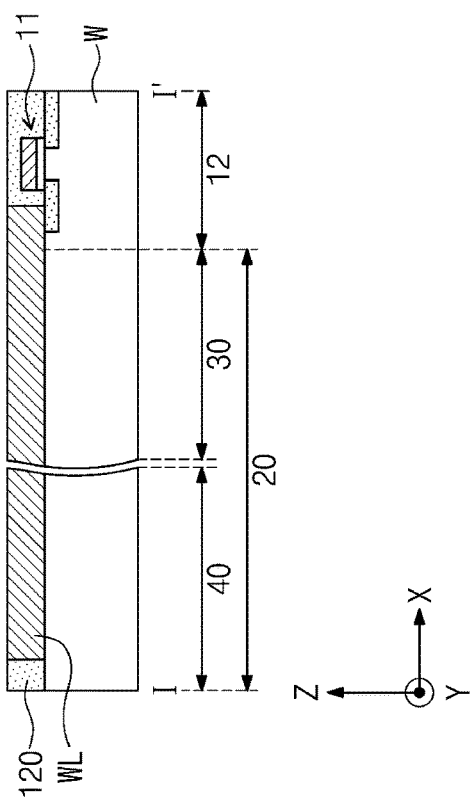

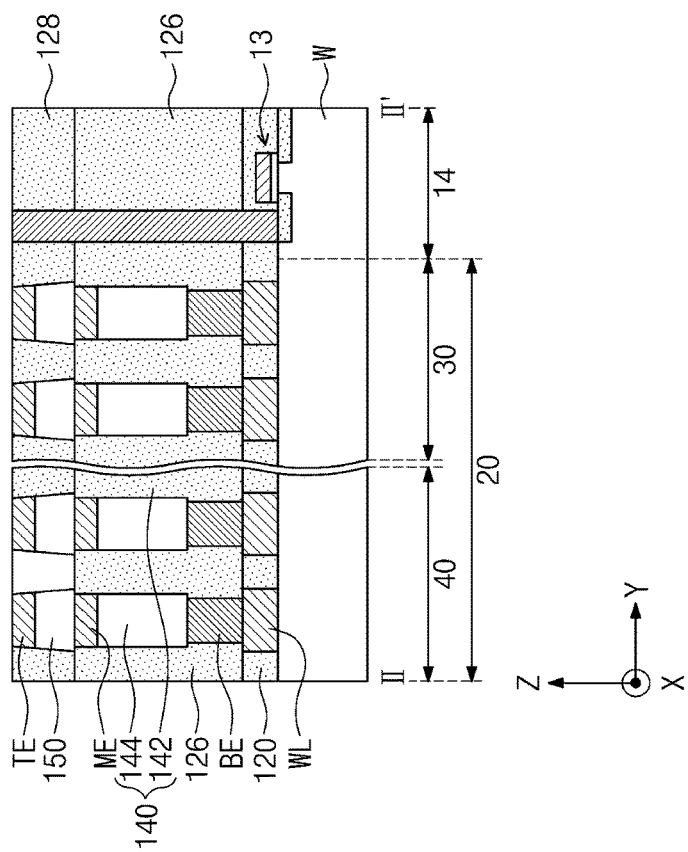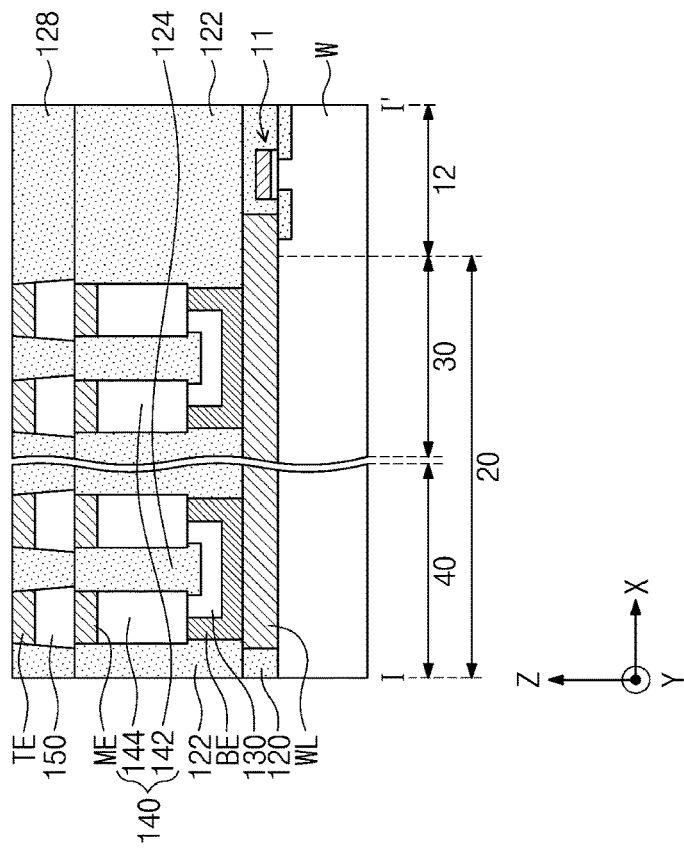
FIG. 15A
FIG. 15B

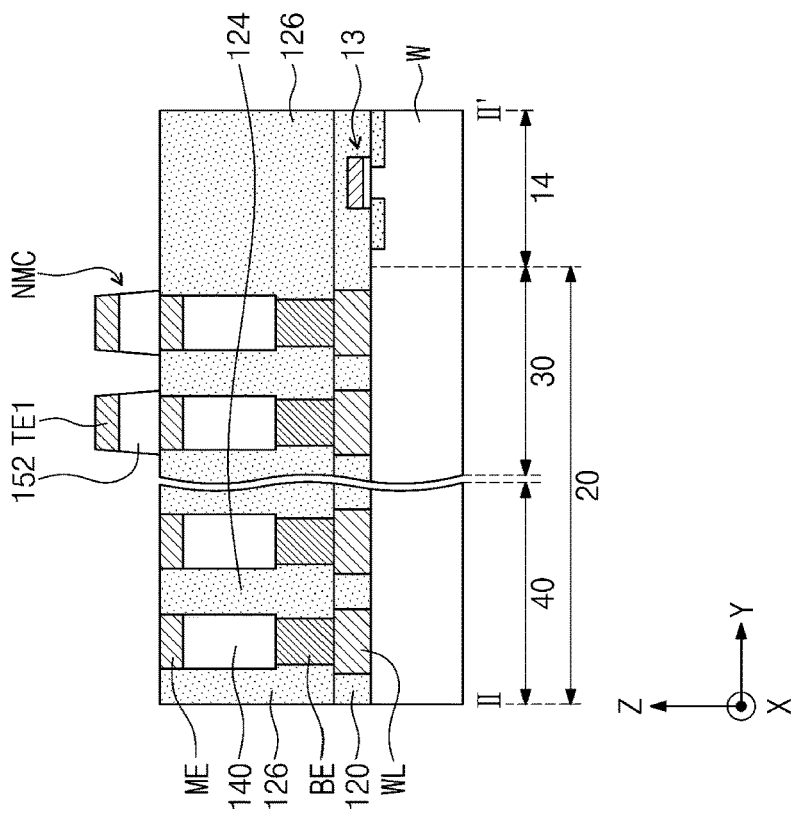
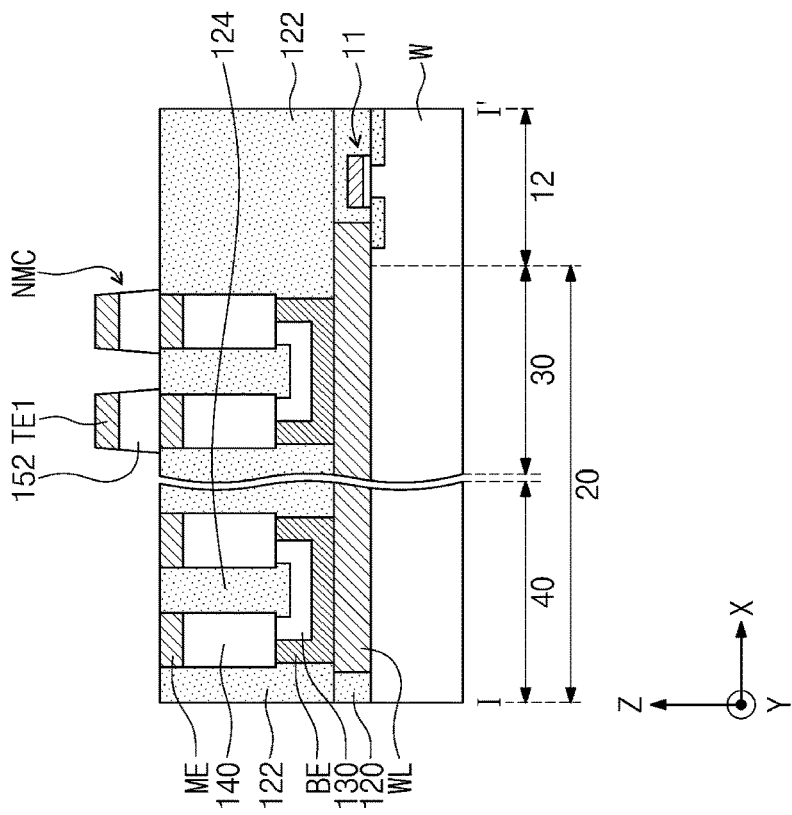

VARIABLE RESISTANCE MEMORY DEVICE

CROSS-REFERENCE TO THE RELATED APPLICATION

This U.S. non-provisional patent application claims priority under 35 U.S.C. § 119 to Korean Patent Application No. 10-2018-0119098, filed on Oct. 5, 2018, in the Korean Intellectual Property Office, the disclosure of which is hereby incorporated by reference in its entirety.

BACKGROUND

Embodiments of the inventive concepts relate to a semiconductor device and, more particularly, to a variable resistance memory device.

Generally, semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device.

In addition, next-generation semiconductor memory devices such as ferroelectric random access memory (FRAM) devices, magnetic random access memory (MRAM) devices, and phase-change random access memory (PRAM) devices have been developed to provide high-performance and low power consuming semiconductor memory devices. Materials of these next-generation semiconductor memory devices may have resistance values variable according to currents or voltages applied thereto, and may retain their resistance values even when currents or voltages are interrupted.

SUMMARY

Various embodiments of the inventive concepts may provide a variable resistance memory device capable of improving uniformity of driving currents or driving voltages.

According to an aspect of example embodiments, there is provided a variable resistance memory device which may include: a substrate including a peripheral region and a core region, the core region including a far region spaced apart from the peripheral region and a near region between the far region and the peripheral region; first conductive lines disposed on the substrate and extending in a first direction; second conductive lines disposed on the first conductive lines and extending in a second direction intersecting the first direction, and memory cells disposed between the first and second conductive lines on the core region. The memory cells may include a near memory cell disposed on the near region, and a far memory cell disposed on the far region. A resistance or threshold voltage of the near memory cell, controlling connection of each of the memory cells to a corresponding one of the second conductive lines, may be different from that of the far memory cell.

According to an aspect of example embodiments, there is provided a variable resistance memory device which may include: a substrate including a peripheral region and a core region, the core region including a far region spaced apart from the peripheral region and a near region between the far region and the peripheral region; first conductive lines disposed on the substrate and extending in a first direction; second conductive lines disposed on the first conductive lines and extending in a second direction intersecting the first direction, and memory cells disposed between the first and second conductive lines on the core region. The memory cells may include a near memory cell disposed on the near region and including a first variable resistance element and a first switching element, and a far memory cell disposed on the far region and including a second variable resistance element and a second switching element. A resistance or threshold voltage of the first variable resistance element, controlling connection of the near memory cells to a corresponding one of the second conductive lines may be different from a resistance or threshold voltage of the second variable resistance element controlling connection of the far memory cells to a corresponding one of the second conductive lines.

BRIEF DESCRIPTION OF THE DRAWINGS

The inventive concepts will become more apparent in view of the attached drawings and accompanying detailed description.

FIGS. 2A-2B are cross-sectional views taken along lines I-I' and II-II' of FIG. 1, respectively.

FIGS. 8A-8B to 15A-15B are cross-sectional views taken along the lines I-I' and II-II' of FIG. 1, respectively, to illustrate the method of manufacturing the variable resistance memory device of FIG. 2, according to some embodiments.

FIGS. 23A-23B and 24A-24B are cross-sectional views illustrating a method of forming first and second switching elements and first and second top electrodes of FIG. 4, according to some embodiments.

DETAILED DESCRIPTION OF THE EMBODIMENTS

The embodiments described herebelow are all exemplary, and thus, the inventive concepts are not limited to these embodiments disclosed below, and may be realized in various other forms of embodiment.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
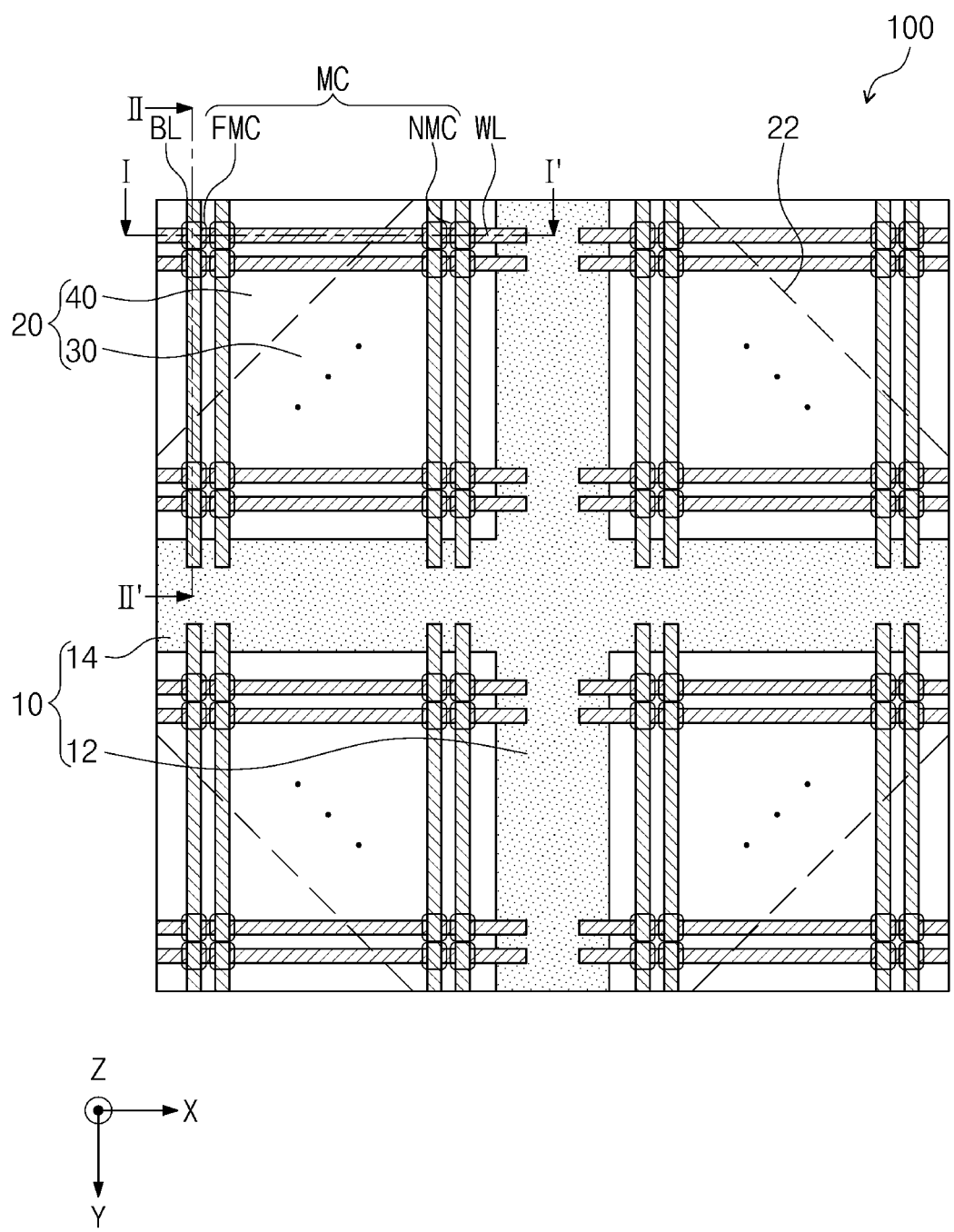
FIG. 1 is a plan view illustrating a variable resistance memory device according to some embodiments.

FIG. 1 is a plan view illustrating a variable resistance memory device 100 according to some embodiments. FIGS. 2A-2B are cross-sectional views taken along lines I-I' and II-II' of FIG. 1, respectively.

Referring to FIGS. 1 and 2A-2B, a variable resistance memory device 100 according to some embodiments may be a phase change random access memory (PRAM) device. In some embodiments, the variable resistance memory device 100 may include a substrate W, first lines WL, second lines BL, and memory cells MC. The first lines WL and the second lines BL are conductive lines.

The substrate W may be a silicon wafer. For example, the substrate W may have a quadrilateral shape. Alternatively, the substrate W may have a circular shape or a polygonal shape. However, embodiments are not limited thereto. In some embodiments, the substrate W may include a peripheral region 10 and core regions 20.

The peripheral region 10 may be disposed between the core regions 20. In some embodiments, the peripheral region 10 may define the core regions 20. The peripheral region 10 may be a region on which circuits for driving the memory cells MC are disposed. For example, the peripheral region 10 may have a cross shape or a lattice shape. In some embodiments, the peripheral region 10 may include a column region 12 and a row region 14. The column region 12 may extend in a second direction Y and may have a first driving unit 11. The first driving unit 11 may be connected to the first line WL. The row region 14 may extend in a first direction X and may have a second driving unit 13. The second driving unit 13 may be connected to the second line BL through a contact plug 170. Each of the first and second driving units 11 and 13 may include a transistor (e.g., a transistor formed directly on the substrate W or a thin film transistor). A lower insulating layer 120 may be provided on the first and second driving units 11 and 13. Even though not shown in the drawings, the peripheral region 10 may have a controller for reading or writing logical data from or into the memory cells MC.

The core region 20 may be a region on which the memory cells MC are disposed. For example, the core region 20 may have a quadrilateral shape. In some embodiments, the core region 20 may include a near region 30 and a far region 40. The near region 30 may be a region adjacent to the peripheral region 10. The far region 40 may be a region spaced apart from the peripheral region 10. The near region 30 may be disposed between the peripheral region 10 and the far region 40. For example, the near region 30 may be disposed adjacent to a corner of the core region 20, which is adjacent to the peripheral region 10. The far region 40 may be disposed adjacent to another corner of the core region 20, which is spaced apart from the peripheral region 10.

In some embodiments, a first boundary 22 between the near region 30 and the far region 40 may extend in a diagonal direction between the first direction X and the second direction Y. When the core region 20 has a quadrilateral shape, the far region 40 may have a triangular shape and the near region 30 may have a trapezoidal shape or a pentagonal shape. Alternatively, the near region 30 and the far region 40 may have triangular shapes. Alternatively, the far region 40 may have a trapezoidal shape or a pentagonal shape, and the near region 30 may have a triangular shape. However, embodiments of the inventive concepts are not limited thereto.

The first lines WL may be disposed on the substrate W. The first lines WL may be disposed on the core region 20 and the column region 12. The first lines WL may extend from the column region 12 onto the core region 20 in the first direction X. The first lines WL may be word lines or row lines. Each of the first lines WL may have a width of about 20 nm and a thickness of about 20 nm. A resistance of the first line WL may increase in proportion to a distance from the first driving unit 11 on the column region 12. The first line WL from the peripheral region 10 to the far region 40 may have a resistance of about 4 KΩ. Top surfaces of the first lines WL may be substantially coplanar with a top surface of the lower insulating layer 120.

The second lines BL may be disposed on the first lines WL. The second lines BL may be disposed on the core region 20 and the row region 14. The second lines BL may extend from the row region 14 onto the core region 20 in the second direction Y. The second lines BL may be bit lines or column lines. Each of the second lines BL may have a width of about 20 nm and a thickness of about 20 nm. A resistance of the second line BL may increase in proportion to a distance from the second driving unit 13 on the row region 14. The second line BL from the peripheral region 10 to the far region 40 may have a resistance of about 4 KΩ.

The memory cells MC may be disposed on the core region 20. The memory cells MC may be disposed at intersection points of the first lines WL and the second lines BL. Each of the memory cells MC may be connected to a corresponding one of the first lines WL and a corresponding one of the second lines BL. In some embodiments, the memory cells MC may include near memory cells NMC and far memory cells FMC. The near memory cells NMC may be disposed on the near region 30. The far memory cells FMC may be disposed on the far region 40. In some embodiments, each of the near and far memory cells NMC and FMC may include a bottom electrode BE, a variable resistance element 140, an intermediate electrode ME, a switching element 150, and a top electrode TE.

The bottom electrode BE may be disposed between the first line WL and the variable resistance element 140. The bottom electrode BE may connect the variable resistance element 140 to the first line WL. The bottom electrode BE may be a heater electrode that heats the variable resistance element 140 to change a phase of the variable resistance element 140. The bottom electrode BE may be formed of a material of which a resistivity is greater than that of the first line WL. For example, the bottom electrode BE may include at least one of W, Ti, Al, Cu, C, CN, TiN, TiAlN, TiSiN, TiCN, WN, CoSiN, WSiN, TaN, TaCN, TaSiN, and TiO. In some embodiments, the bottom electrode BE may be shared by a pair of the variable resistance elements 140 adjacent to each other in the first direction X. For example, the bottom electrode BE may include a horizontal portion connected to the first line WL, and a pair of vertical portions extending from both end portions of the horizontal portion to the pair of variable resistance elements 140, respectively. A first interlayer insulating layer 122 may be provided outside the pair of vertical portions in the first direction X, and a second interlayer insulating layer 124 may be provided on the horizontal portion. In addition, a third interlayer insulating layer 126 may be provided between the bottom electrodes BE adjacent to each other in the second direction Y. The first to third interlayer insulating layers 122, 124 and 126 may include a dielectric material such as silicon oxide or silicon nitride.

A spacer pattern 130 may be provided between the bottom electrode BE and the second interlayer insulating layer 124. The spacer pattern 130 may extend along the horizontal portion and the vertical portions of the bottom electrode BE. For example, the spacer pattern 130 may include silicon oxide and/or silicon oxynitride. The second interlayer insulating layer 124 may be formed of the same or similar dielectric material as the spacer pattern 130.

The variable resistance element 140 may be disposed between the bottom electrode BE and the second line BL. The variable resistance element 140 may have a resistance value which is variable to store logical data. The variable resistance element 140 may be formed of at least one of materials having properties capable of storing logical data. When the variable resistance memory device 100 according to some embodiments is a phase change memory device, the variable resistance element 140 may include a material of which a phase is reversibly changeable between a crystalline phase and an amorphous phase by temperature.

For example, a phase transition temperature between the crystalline and amorphous phases of the variable resistance element 140 may range from about 250 degrees Celsius to about 350 degrees Celsius. The variable resistance element 140 may be formed of a compound that includes at least one of Te and Se (i.e., chalcogenide elements) and at least one of Ge, Sb, Bi, Pb, Sn, Ag, As, S, Si, In, Ti, Ga, P, O, and C.

Meanwhile, a resistance of the variable resistance element 140 may vary depending on distances from the first and second driving units 11 and 13, which may be current conduction distances. For example, the variable resistance elements 140 may include a first variable resistance element 142 and a second variable resistance element 144. The first variable resistance element 142 may be disposed on the near region 30. The second variable resistance element 144 may be disposed on the far region 40. In other words, the near memory cell NMC may include the first variable resistance element 142, and the far memory cell FMC may include the second variable resistance element 144. For example, the first variable resistance element 142 may include GeTe or GeSbTe, and the second variable resistance element 144 may include SbTe. Alternatively, a Ge content of the first variable resistance element 142 may be higher than a Ge content of the second variable resistance element 144. When the first and second variable resistance elements 142 and 144 have the same phase, a resistance of the first variable resistance element 142 may be different from a resistance of the second variable resistance element 144. The resistance of the first variable resistance element 142 may be higher than the resistance of the second variable resistance element 144. A difference in resistance between the first and second variable resistance elements 142 and 144 may compensate line resistance differences of the first and second lines WL and BL between the far region 40 and the near region 30, thereby improving uniformity of driving currents of the first and second driving units 11 and 13.

For example, when the first and second lines WL and BL have a line resistance of about 8 KΩ, the difference in resistance between the first and second variable resistance elements 142 and 144 may be about 8 KΩ. The resistance of the second variable resistance element 144 may be less than the resistance of the first variable resistance element 142 by about 8 KΩ. A sum of the resistances of the first variable resistance element 142 and the first and second lines WL and BL may be equal or similar to a sum of the resistances of the second variable resistance element 144 and the first and second lines WL and BL. Thus, the first and second driving units 11 and 13 may drive the first and second variable resistance elements 142 and 144 by the same driving currents regardless of the line resistances of the first and second lines WL and BL. As a result, the uniformity of the driving currents may be improved.

The intermediate electrode ME may be disposed between the variable resistance element 140 and the switching element 150. The intermediate electrode ME may electrically connect the variable resistance element 140 and the switching element 150, and may prevent the variable resistance element 140 from being in direct contact with the switching element 150. For example, the intermediate electrode ME may include at least one of W, Ti, Al, Cu, C, CN, TiN, TiAlN, TiSiN, TiCN, WN, CoSiN, WSiN, TaN, TaCN, and TaSiN. Top surfaces of the first to third interlayer insulating layers 122, 124 and 126 may be substantially coplanar with a top surface of the intermediate electrode ME. Alternatively, the intermediate electrode ME may be provided on the first to third interlayer insulating layers 111, 113 and 115.

The switching element 150 may be disposed between the intermediate electrode ME and the second line BL. The switching element 150 may be connected to the second line BL. The switching element 150 may connect the second line BL to the variable resistance element 140 by a voltage higher than a threshold voltage ($V_{th}$) of the switching element 150. In some embodiments, the switching element 150 may include an ovonic threshold switch (OTS) element having a bi-directional characteristic. The switching element 150 may include an element based on a threshold switching phenomenon having a nonlinear I-V curve (e.g., a S-shaped I-V curve). The switching element 150 may have a phase transition temperature between crystalline and amorphous phases, which is higher than that of the variable resistance element 140. For example, the phase transition temperature of the switching element 150 may range from about 350 degrees Celsius to about 450 degrees Celsius. Thus, when the variable resistance memory device 100 according to the embodiments is operated, the phase of the variable resistance element 140 may be reversibly changed between the crystalline and amorphous phases by an operating voltage (e.g., a program voltage), but the switching element 150 may be maintained in a substantially amorphous state without phase change even though the operating voltage is applied thereto. In the present specification, the term 'substantially amorphous state' may include an amorphous state, and may also include a case in which a grain boundary or a crystallized portion locally exists in a portion of a component. For example, the switching element 150 may be formed of a compound that includes at least one of Te and Se (i.e., chalcogenide elements) and at least one of Ge, Sb, Bi, Al, Pb, Sn, Ag, As, S, Si, In, Ti, Ga, and P. The switching element 150 may further include a thermal stabilization element in addition to the compound. The thermal stabilization element may include at least one of C, N, and O. For example, the switching element 150 may include at least one of AsTe, AsSe, SnTe, SnSe, ZnTe, ZnSe GeTe, GeSe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

The top electrode TE may be disposed between the switching element 150 and the second line BL. The top electrode TE may connect the second line BL to the switching element 150. For example, the top electrode TE may include at least one of W, Ti, Al, Cu, C, CN, TiN, TiAlN, TiSiN, TiCN, WN, CoSiN, WSiN, TaN, TaCN, TaSiN, and TiO.

A fourth interlayer insulating layer 128 may be provided to fill a space between the top electrodes TE. The fourth interlayer insulating layer 128 may be disposed between an upper insulating layer 160 and the first to third interlayer insulating layers 122, 124 and 126. A top surface of the fourth interlayer insulating layer 128 may be substantially coplanar with top surfaces of the top electrodes TE. For example, the fourth interlayer insulating layer 128 may include at least one of silicon oxide, silicon nitride, silicon oxynitride, silicon oxycarbide, silicon oxycarbonitride, and silicon carbonitride. The upper insulating layer 160 and the second lines BL may be provided on the fourth interlayer insulating layer 128.

The contact plug 170 may be provided in the third and fourth interlayer insulating layers 126 and 128 between the second line BL and the second driving unit 13. The contact plug 170 may connect the second line BL to the second driving unit 13.

Figure 3A:
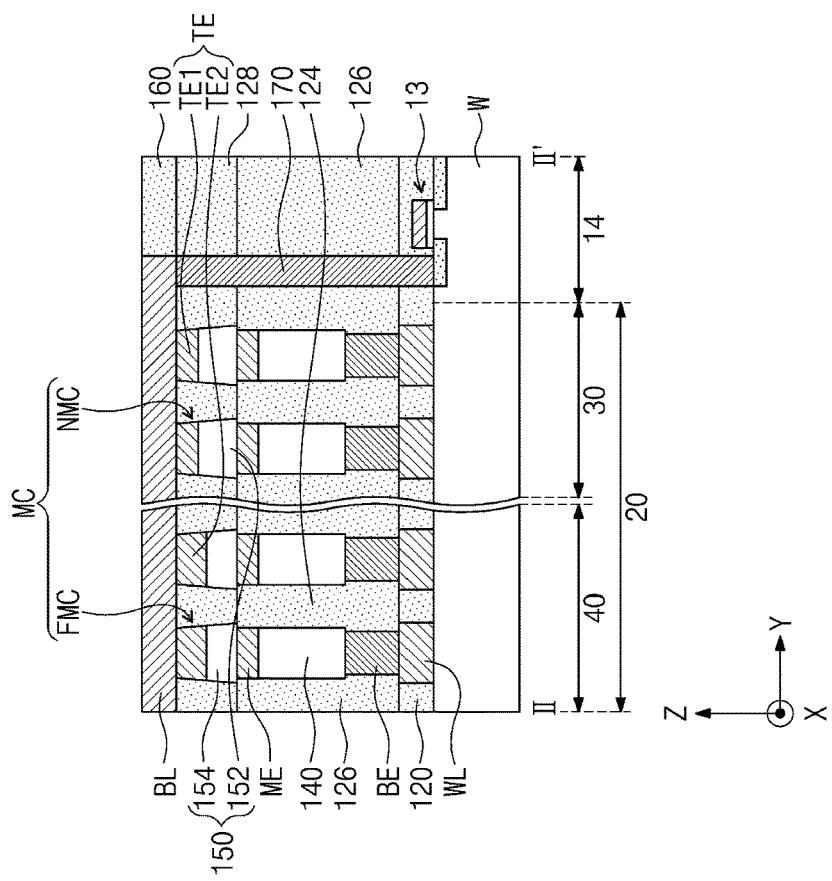
FIGS. 3A-3B are cross-sectional views taken along the lines I-I' and II-II' of FIG. 1, respectively, to illustrate memory cells according to some embodiments.
Figure 3B:
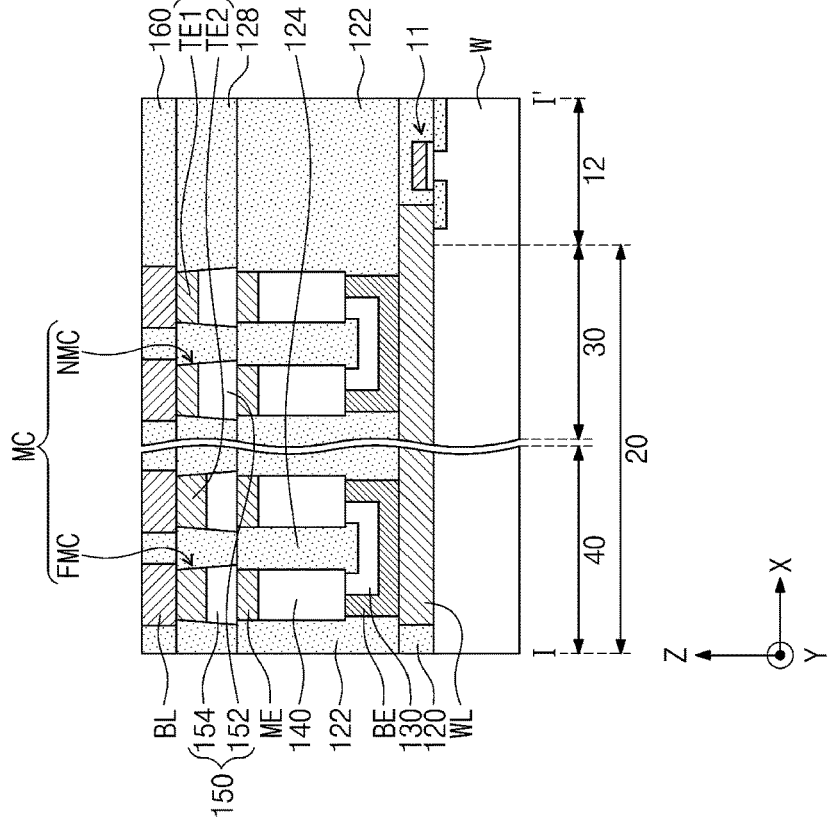

FIGS. 3A-3B are cross-sectional views taken along the lines I-I' and II-II' of FIG. 1, respectively, to illustrate memory cells MC according to some embodiments.

Referring to FIGS. 3A-3B, switching elements 150 of memory cells MC may include a first switching element 152 and a second switching element 154. The first switching element 152 may be disposed on the near region 30, and the second switching element 154 may be disposed on the far region 40. In other words, the near memory cell NMC may include the first switching element 152, and the far memory cell FMC may include the second switching element 154. In some embodiments, the first switching element 152 may be thicker than the second switching element 154. A threshold voltage of the first switching element 152 may be higher than a threshold voltage of the second switching element 154. A difference between the threshold voltage of the first switching element 152 and the threshold voltage of the second switching element 154 may compensate voltage drops caused by the line resistances of the first and second lines WL and BL on the far region 40, and thus, uniformity of driving voltages of the first and second driving units 11 and 13 may be improved. The variable resistance element 140 on the near region 30 and the variable resistance element 140 on the far region 40 may be formed of the same material (e.g., GeSbTe). The first and second driving units 11 and 13 may turn on/turn off the first and second switching elements 152 and 154 by the same or similar driving voltages. As a result, the uniformity of the driving voltages may be improved.

Thicknesses of top electrodes TE between the second lines BL and the first and second switching elements 152 and 154 may vary depending on a difference in thickness between the first and second switching elements 152 and 154. For example, the top electrodes TE may include first and second top electrodes TE1 and TE2. The first and second top electrodes TE1 and TE2 may be disposed on the first and second switching elements 152 and 154, respectively. The first top electrode TE1 may be thinner than the second top electrode TE2. Each of the first and second top electrodes TE1 and TE2 may include at least one of W, Ti, Al, Cu, C, CN, TiN, TiAlN, TiSiN, TiCN, WN, CoSiN, WSiN, TaN, TaCN, and TaSiN.

First and second lines WL and BL, a lower insulating layer 120, a bottom electrode BE, an intermediate electrode ME, first to fourth interlayer insulating layers 122, 124, 126 and 128, an upper insulating layer 160, a contact plug 170, and the first and second driving units 11 and 13 may be the same as described with reference to FIG. 2.

Figure 4A:
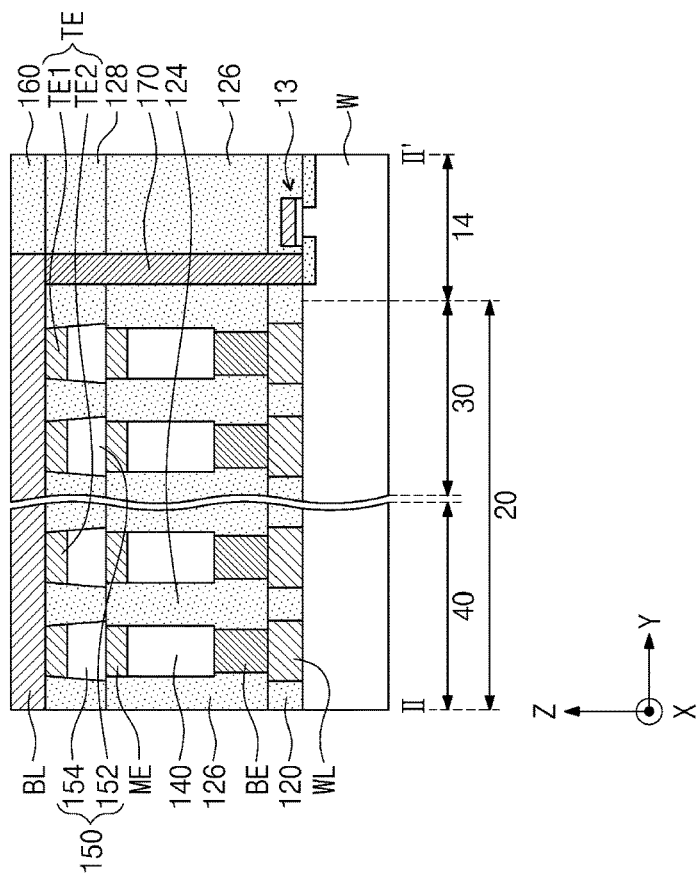
FIGS. 4A-4B are cross-sectional views taken along the lines I-I' and II-II' of FIG. 1, respectively, to illustrate memory cells according to some embodiments.
Figure 4B:
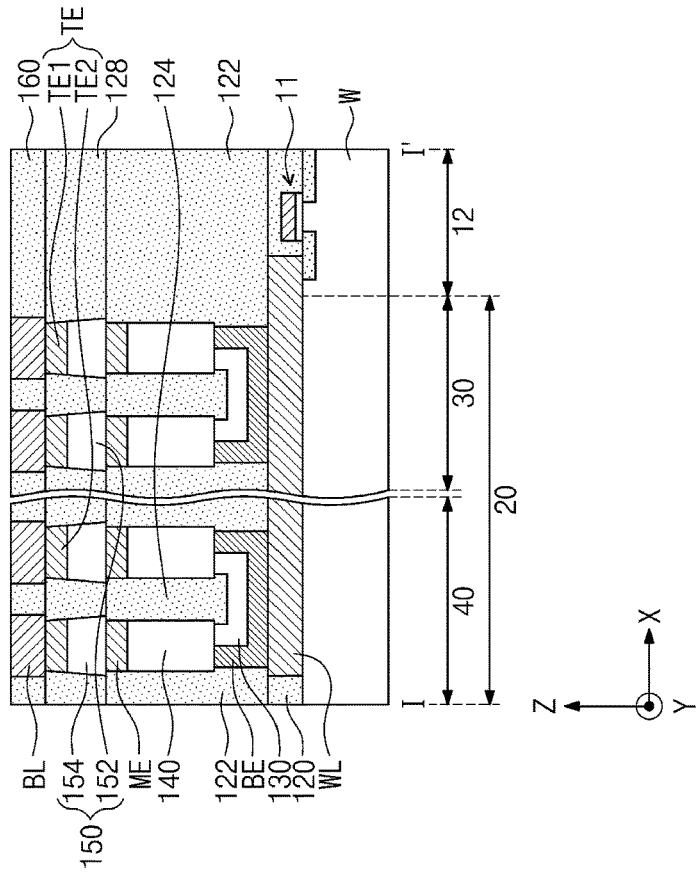

FIGS. 4A-4B are cross-sectional views taken along the lines I-I' and II-II' of FIG. 1, respectively, to illustrate memory cells MC according to some embodiments.

Referring to FIG. 4, first and second switching elements 152 and 154 may have the same thickness and may have different components. The first switching element 152 may be disposed on the near region 30, and the second switching element 154 may be disposed on the far region 40. For example, a threshold voltage of the first switching element 152 may be higher than a threshold voltage of the second switching element 154. For example, the first switching element 152 may include AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe, and the second switching element 154 may include AsTe, AsSe, SnTe, SnSe, ZnTe, ZnSe, or AsTeSe. Alternatively, a content of Ge, N, Si, or C in the first switching element 152 may be greater than a content of Ge, N, Si, or C in the second switching element 154. A difference between the threshold voltage of the first switching element 152 and the threshold voltage of the second switching element 154 may compensate voltage drops caused by the line resistances of the first and second lines WL and BL on the far region 40, and thus, uniformity of driving voltages of the first and second driving units 11 and 13 may be improved. The variable resistance element 140 on the near region 30 and the variable resistance element 140 on the far region 40 may be formed of the same material (e.g., GeSbTe). The first and second driving units 11 and 13 may turn on/turn off the first and second switching elements 152 and 154 by the same or similar driving voltages.

First and second top electrodes TE1 and TE2 may have the same thickness. Each of the first and second top electrodes TE1 and TE2 may include at least one of W, Ti, Al, Cu, C, CN, TiN, TiAlN, TiSiN, TiCN, WN, CoSiN, WSiN, TaN, TaCN, and TaSiN.

First and second lines WL and BL, a lower insulating layer 120, a bottom electrode BE, the variable resistance element 140, an intermediate electrode ME, first to fourth interlayer insulating layers 122, 124, 126 and 128, an upper insulating layer 160, a contact plug 170, and the first and second driving units 11 and 13 may be the same as in the embodiments of FIG. 3.

Figure 5:
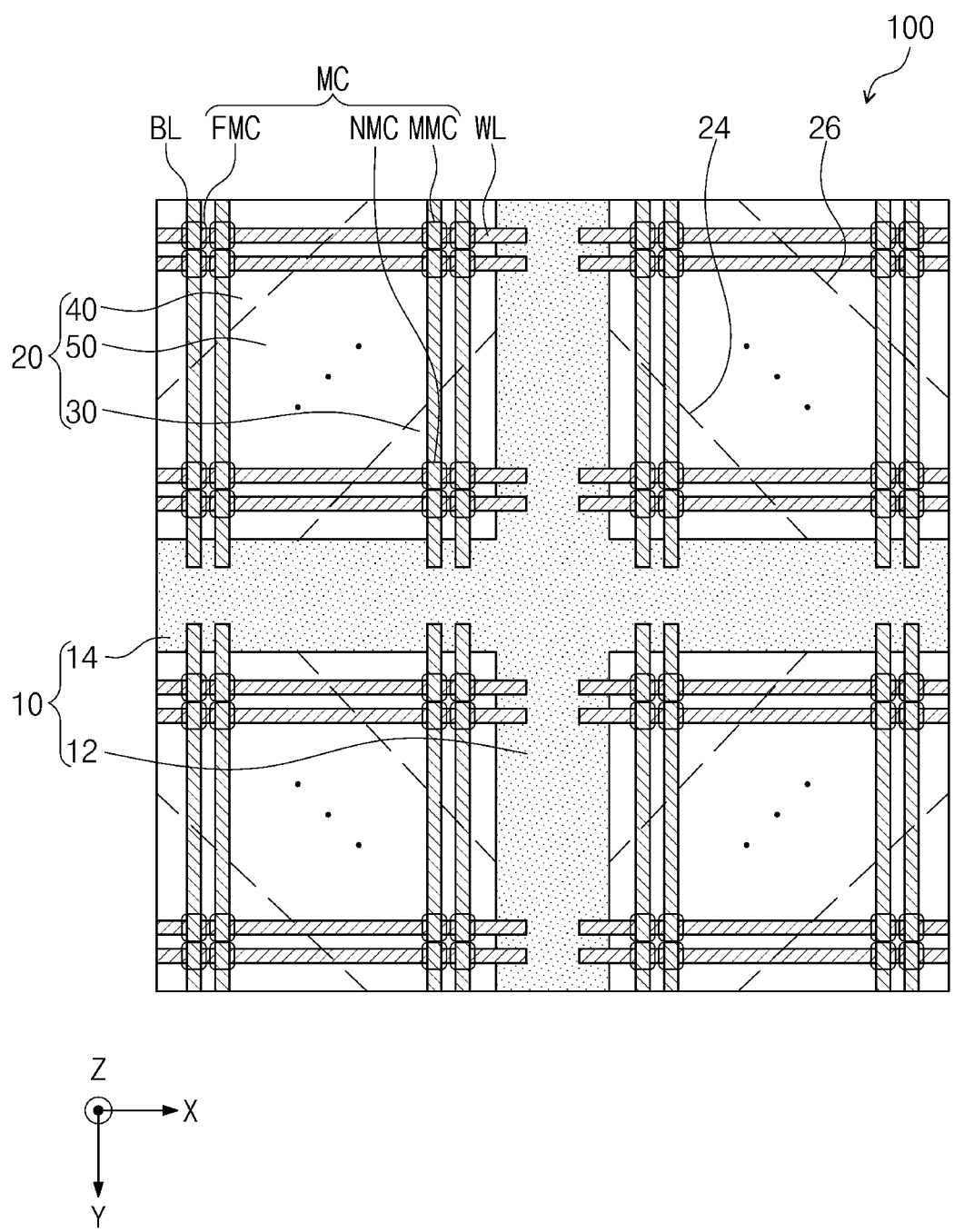
FIG. 5 is a plan view illustrating a variable resistance memory device according to some embodiments.

FIG. 5 is a plan view illustrating a variable resistance memory device 100 according to some embodiments.

Referring to FIG. 5, memory cells MC of a variable resistance memory device 100 according to some embodiments may include a near memory cell NMC, a far memory cell FMC, and a middle memory cell MMC between the near memory cell NMC and the far memory cell FMC. The near memory cell NMC and the far memory cell FMC may be the same as described with reference to FIG. 1. A resistance or threshold voltage of the middle memory cell MMC may be greater than the resistance or threshold voltage of the far memory cell FMC, and may be less than the resistance or threshold voltage of the near memory cell NMC. The middle memory cell MMC may be disposed on a middle region 50 of a substrate W. The middle region 50 may be disposed between a near region 30 and a far region 40. A second boundary 24 may be defined between the near region 30 and the middle region 50. In addition, a third boundary 26 may be defined between the middle region 50 and the far region 40. Each of the second and third boundaries 24 and 26 may extend in a diagonal direction with respect to the first and second directions X and Y. For example, the near region 30 and the far region 40 may have triangular shapes in a plan view, and the middle region 50 may have a hexagonal shape in a plan view. However, embodiments of the inventive concepts are not limited thereto.

Figure 6:
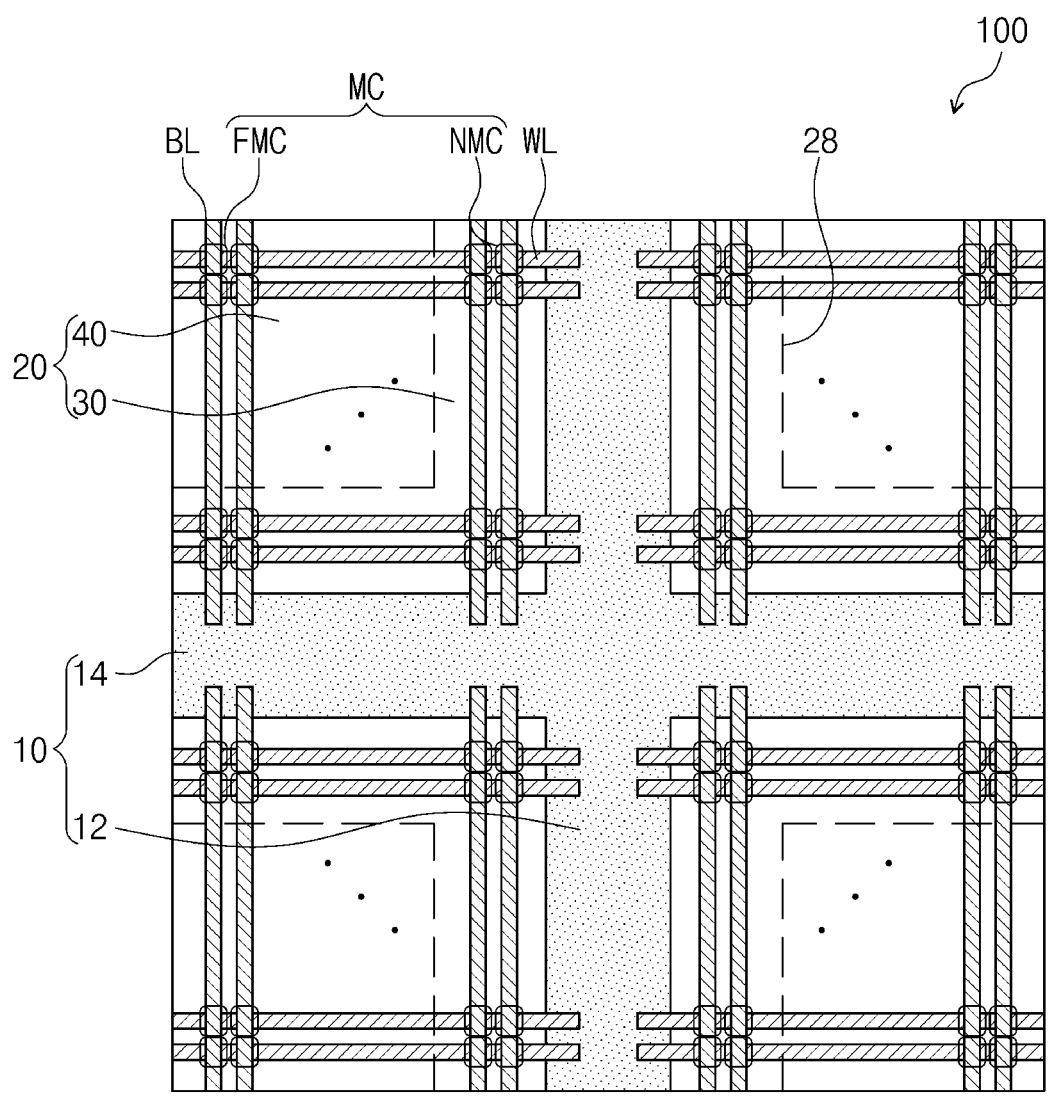
FIG. 6 is a plan view illustrating a variable resistance memory device according to some embodiments.

FIG. 6 is a plan view illustrating a variable resistance memory device 100 according to some embodiments.

Referring to FIG. 6, a fourth boundary 28 having a L-shape may be defined between a near region 30 and a far region 40 of a core region 20 of a variable resistance memory device 100 according to some embodiments when viewed in a plan view. The near region 30 may have a L-shape in a plan view, and the far region 40 may have a quadrilateral shape in a plan view. Even though not shown in the drawings, the core region 20 may further include a middle region between the near region 30 and the far region 40, and the middle region may have a L-shape in a plan view.

Figure 7:
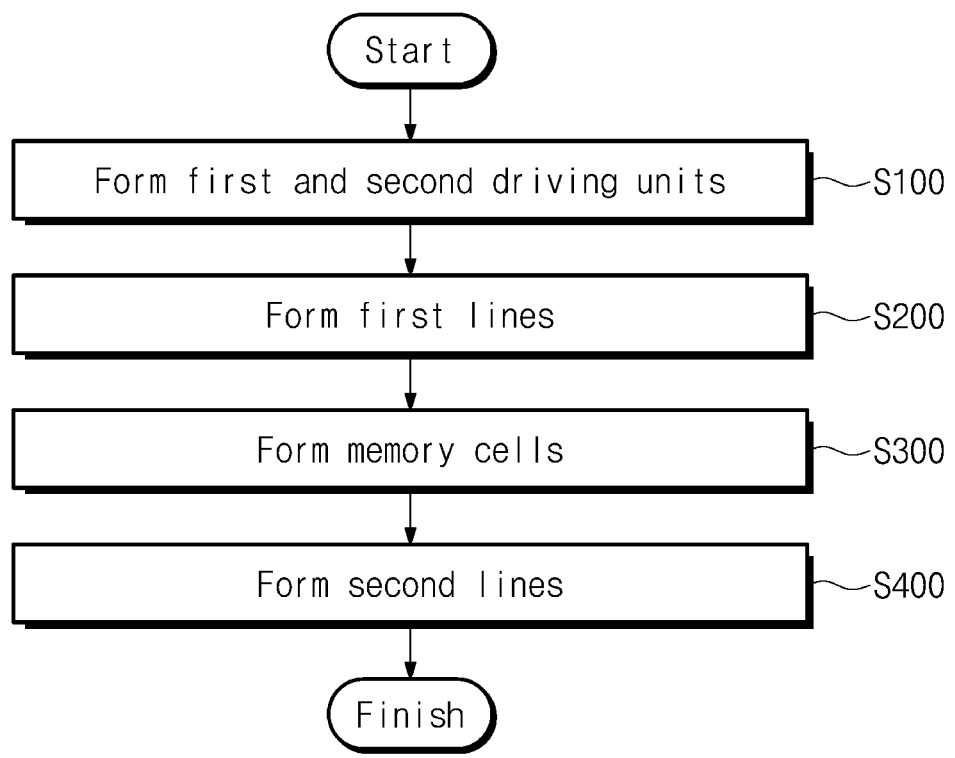
FIG. 7 is a flowchart illustrating a method of manufacturing a variable resistance memory device of FIG. 2, according to some embodiments.

FIG. 7 is a flowchart illustrating a method of manufacturing the variable resistance memory device 100 of FIG. 2.

Referring to FIG. 7, a method of manufacturing a variable resistance memory device according to some embodiments may include forming first and second driving units 11 and 13 (S100), forming first lines WL (S200), forming memory cells MC (S300), and forming second lines BL (S400).

FIGS. 8A-8B to 15A-15B are cross-sectional views taken along the lines I-I' and II-II' of FIG. 1, respectively, to illustrate the method of manufacturing the variable resistance memory device of FIGS. 2A-2B.

Referring to FIGS. 7 and 8A-8B, the first and second driving units 11 and 13 may be formed on a peripheral region 10 of a substrate W (S100). Each of the first and second driving units 11 and 13 may include a transistor (e.g., a transistor formed directly on the substrate W or a thin film transistor). Detailed descriptions to the process of forming the first and second driving units 11 and 13 are omitted for the purpose of ease and convenience in explanation.

Referring to FIGS. 7 and 9A-9B, the first lines WL may be formed on the core region 20 and the first driving unit 11 (S200). The first lines WL may be formed by a deposition process of a metal layer, a photolithography process, and an etching process. Thereafter, a lower insulating layer 120 may be formed between the first lines WL. Alternatively, the first lines WL may be formed by a damascene method. In other words, the lower insulating layer 120 having lower trenches may be formed on the substrate W, and then, the first lines WL may be formed in the lower trenches by a deposition process of a metal layer and a chemical mechanical polishing (CMP) process performed on the metal layer.

Referring to FIGS. 7, 10A-10B to 15A-15B, the memory cells MC may be formed on the first lines WL (S300).

Figure 16:
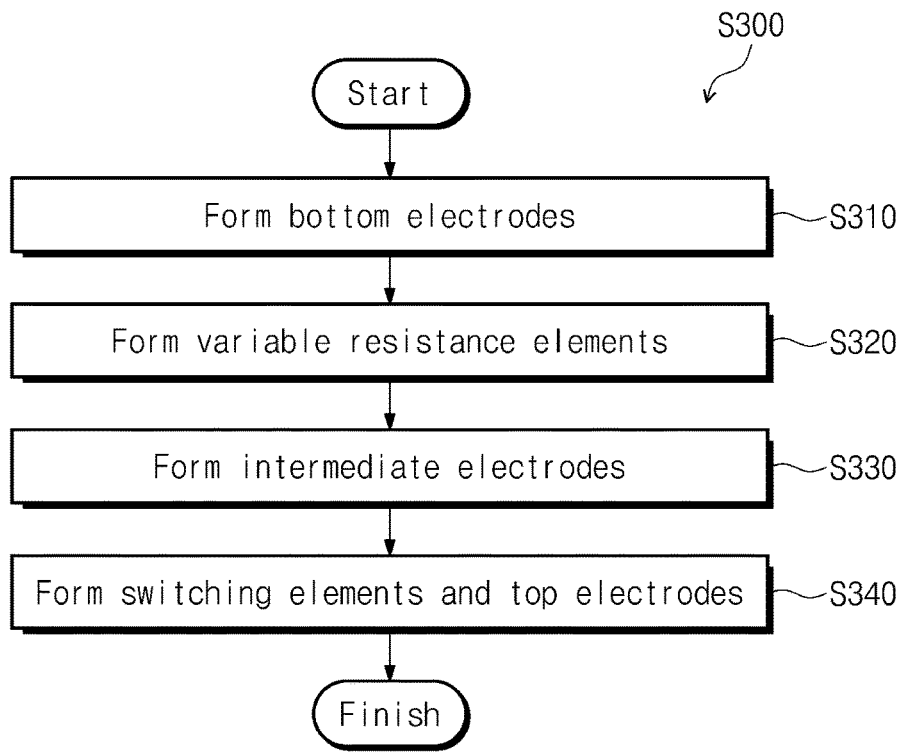
FIG. 16 is a flowchart illustrating an embodiment of a step of forming memory cells of FIG. 7, according to some embodiments.

FIG. 16 is a flowchart illustrating an embodiment of step S300 of forming the memory cells MC of FIG. 7.

Referring to FIG. 16, step S300 of forming the memory cells MC may include forming bottom electrodes BE (S310), forming variable resistance elements 140 (S320), forming intermediate electrodes ME (S330), and forming switching elements 150 and top electrodes TE (S340).

Figure 10A:
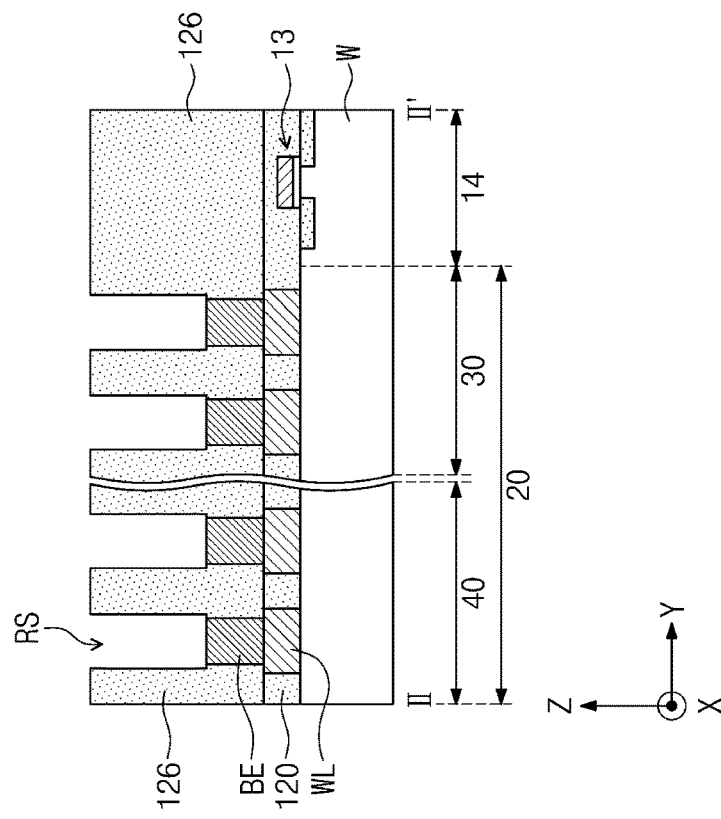
Figure 10B:
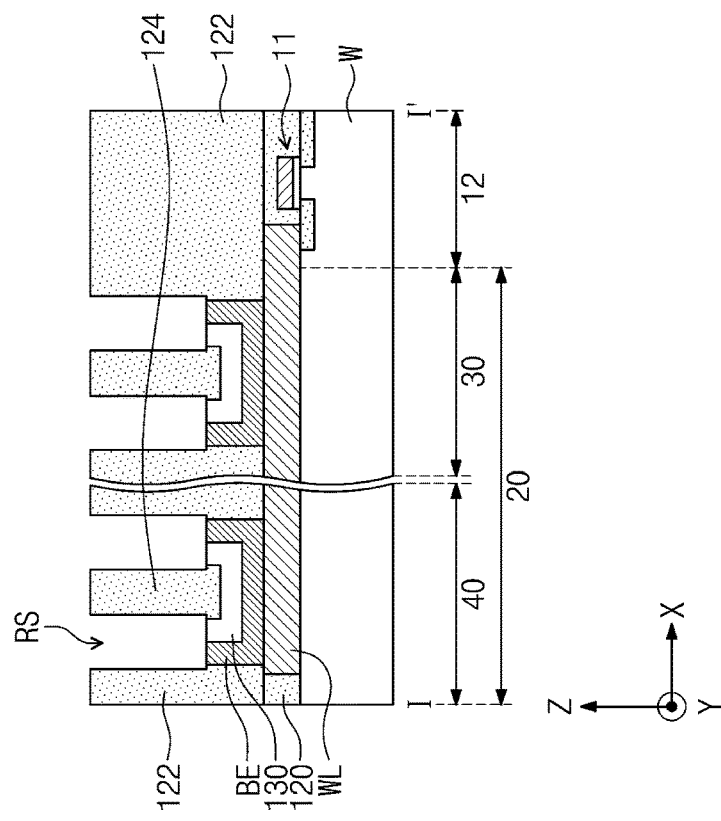

Referring to FIGS. 10A-10B and 16, bottom electrodes BE may be formed on the core region 20 (S310). The bottom electrodes BE may be formed in first to third interlayer insulating layers 122, 124 and 126.

For example, the first interlayer insulating layer 122 may be formed on the first lines WL and the lower insulating layer 120. Thereafter, upper trenches may be formed in the first interlayer insulating layer 122 by using an anisotropic etching process. The upper trenches may extend in the second direction Y. Next, an electrode layer and a spacer layer may be conformally formed in the upper trenches. Subsequently, the second interlayer insulating layer 124 may be formed on the spacer layer to fill the upper trenches.

A planarization process may be performed on the second interlayer insulating layer 124 by a chemical mechanical polishing (CMP) method until the first interlayer insulating layer 122 is exposed. Thereafter, the first and second interlayer insulating layers 122 and 124, the spacer layer and the electrode layer, which do not overlap with the first lines WL, may be etched to form opening regions. The opening regions may extend in the first direction X. As a result, the bottom electrodes BE may be formed from the electrode layer, and spacer patterns 130 may be formed from the spacer layer. The bottom electrodes BE may be spaced apart from each other in the first direction X and the second direction Y. Thereafter, the third interlayer insulating layer 126 may be formed to fill the opening regions. A method of forming the third interlayer insulating layer 126 may include a deposition process of a dielectric and a CMP process. For example, the third interlayer insulating layer 126 may be formed of the same material as the first interlayer insulating layer 122.

Recesses RS may be formed to expose the bottom electrodes BE. A method of forming the recesses RS may include a process of etching upper portions of the spacer patterns 130 and a process of etching upper portions of the bottom electrodes BE. Each of the etching processes of the spacer patterns 130 and the bottom electrodes BE may be a wet etching process. Thereafter, an isotropic wet etching process may be performed to expand empty spaces formed by etching the upper portions of the bottom electrodes BE and the upper portions of the spacer patterns 130. For example, the isotropic wet etching process may be performed using an etchant including phosphoric acid.

Referring to FIGS. 11A-11B, 12A-12B and 16, the variable resistance elements 140 may be formed on the bottom electrodes BE (S320). The variable resistance elements 140 may be formed in the recesses RS.

Figure 17:
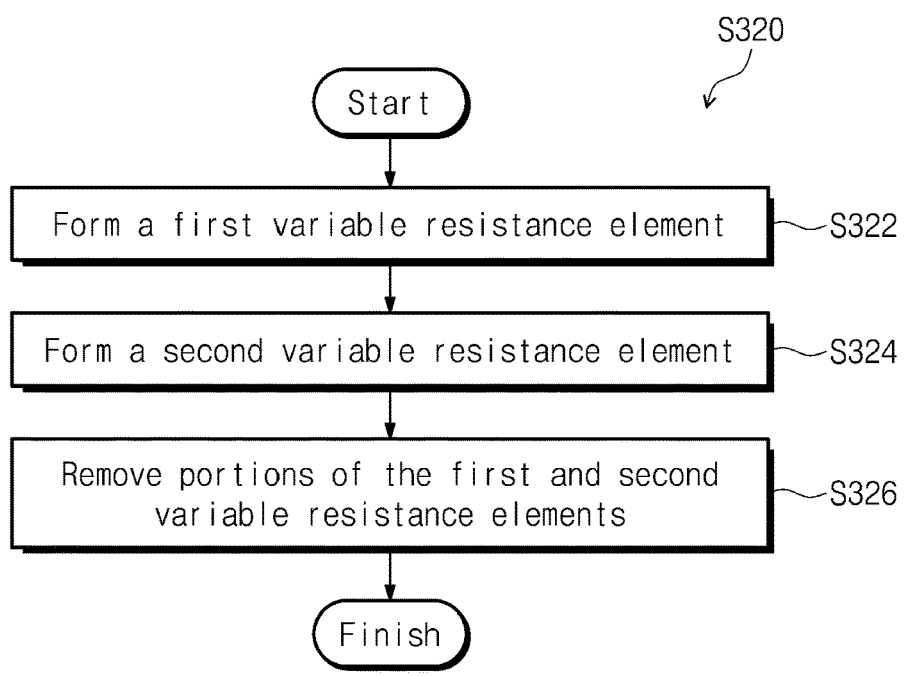
FIG. 17 is a flowchart illustrating an embodiment of a step of forming variable resistance elements of FIG. 16, according to some embodiments.

FIG. 17 is a flowchart illustrating an embodiment of step S320 of forming the variable resistance elements 140 of FIG. 16.

Referring to FIG. 17, step S320 of forming the variable resistance elements 140 may include forming a first variable resistance element (S322), forming a second variable resistance element (S324), and removing portions of the first and second variable resistance elements (S326).

Figure 11A:
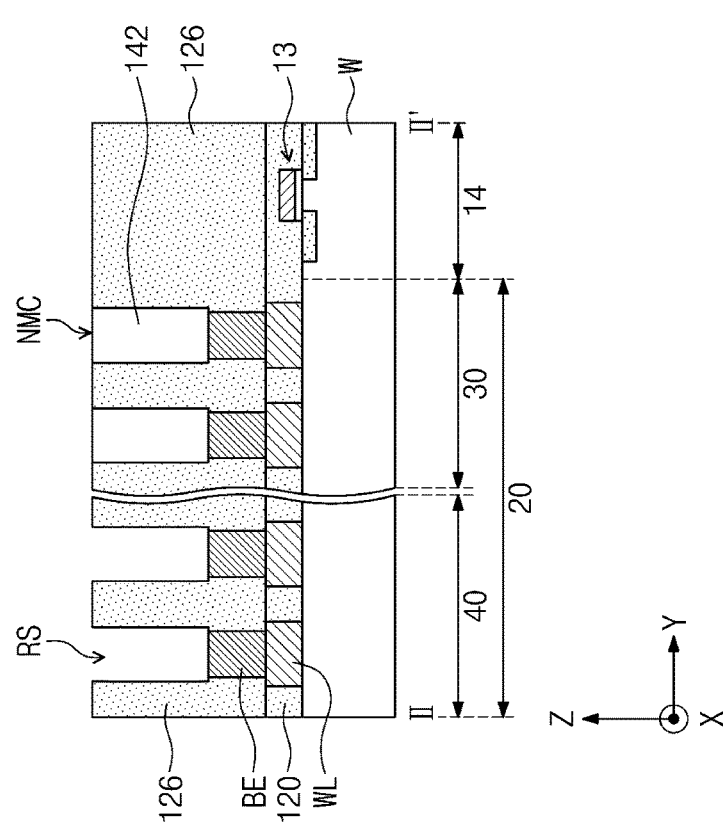
Figure 11B:
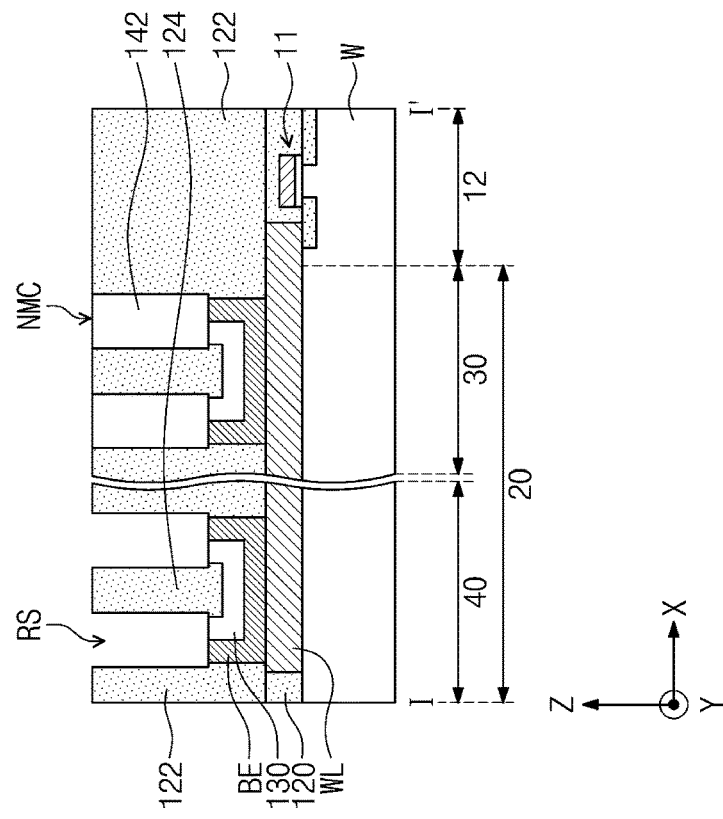

Referring to FIGS. 11A-11B and 17, the first variable resistance element 142 may be formed in the recess RS on the near region 30 (S322). For example, the first variable resistance element 142 may be formed through a deposition process of a first variable resistance layer, a CMP process, a photolithography process, and an etching process. In detail, the first variable resistance layer may be deposited on the bottom electrodes BE and the first to third interlayer insulating layers 122, 124 and 126. The first variable resistance layer may include GeTe or GeSbTe. Next, the first variable resistance layer may be planarized by the CMP process. Thus, the first variable resistance layer may be confined in the recesses RS. Subsequently, a photoresist pattern (not shown) may be formed on the near region 30 by the photolithography process. Next, the first variable resistance layer in the recess RS on the far region 40 may be removed using the etching process. As a result, the first variable resistance element 142 may be formed from the first variable resistance layer on the near region 30. In other words, step S322 of forming the first variable resistance element 142 may be included in a step of forming a near memory cell NMC.

Figure 12A:
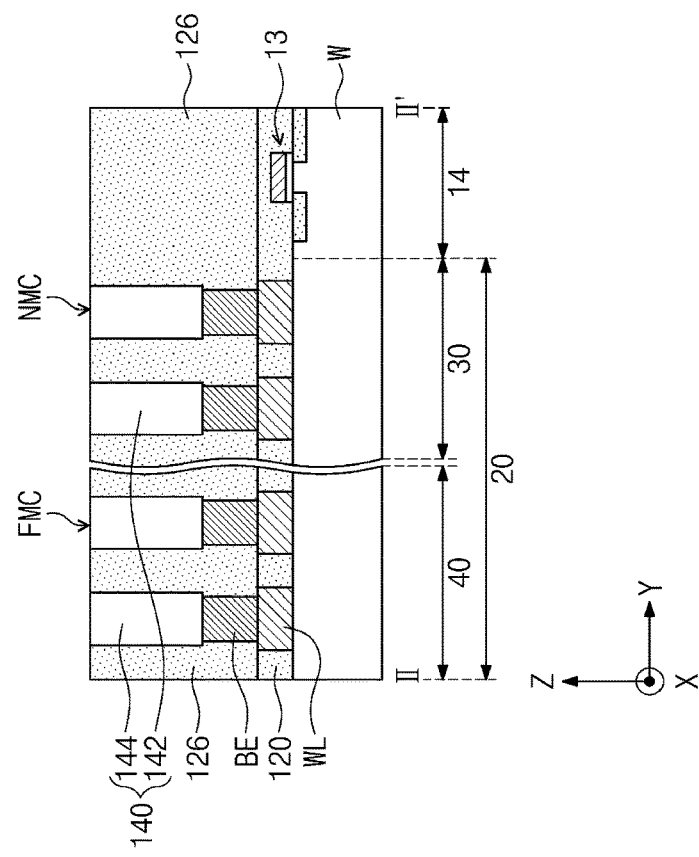
Figure 12B:
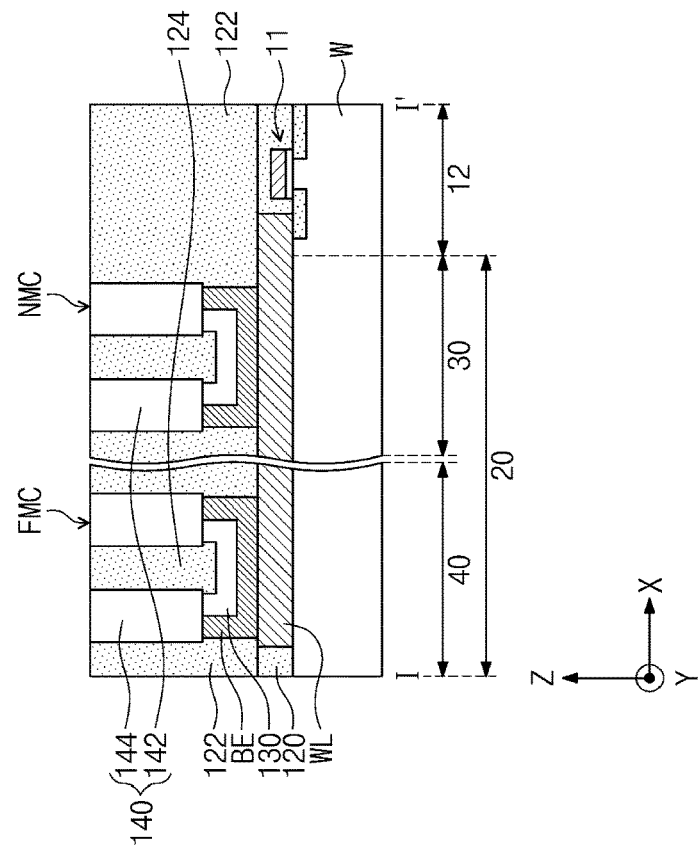

Referring to FIGS. 12A-12B and 17, the second variable resistance element 144 may be formed in the recess RS on the far region 40 (S324). For example, the second variable resistance element 144 may be formed through a deposition process of a second variable resistance layer and a CMP process. In detail, the second variable resistance layer may be deposited on the first variable resistance element 142, the bottom electrode BE, and the first to third interlayer insulating layers 122, 124 and 126. The second variable resistance layer may include SbTe. Next, the second variable resistance layer may be planarized using the CMP process. Thus, the second variable resistance element 144 may be formed from the second variable resistance layer in the recess RS on the far region 40. In other words, step S324 of forming the second variable resistance element 144 may be included in a step of forming a far memory cell FMC.

Figure 13A:
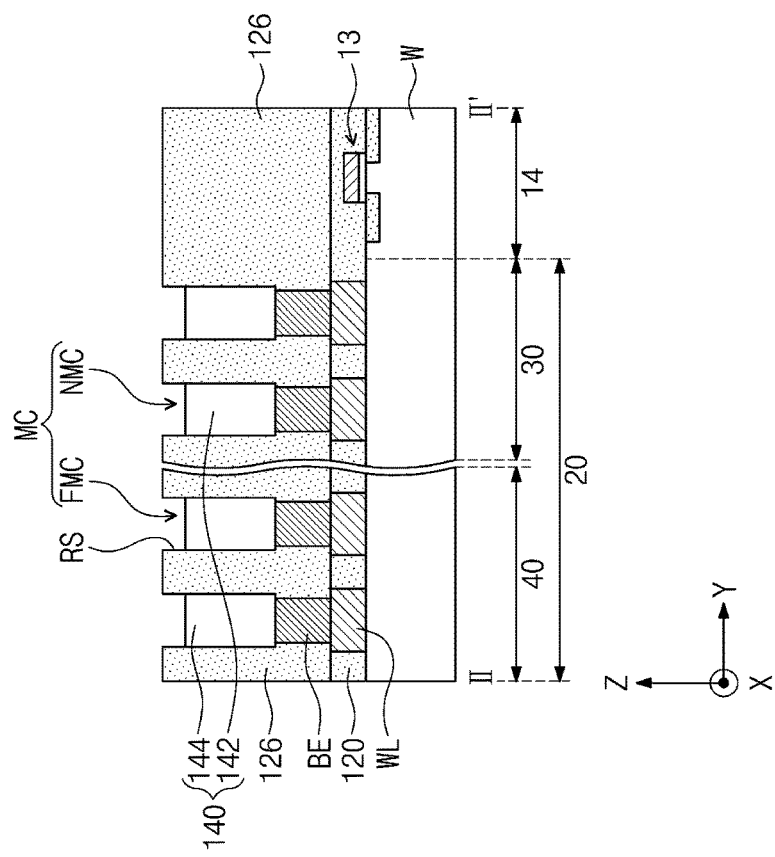
Figure 13B:
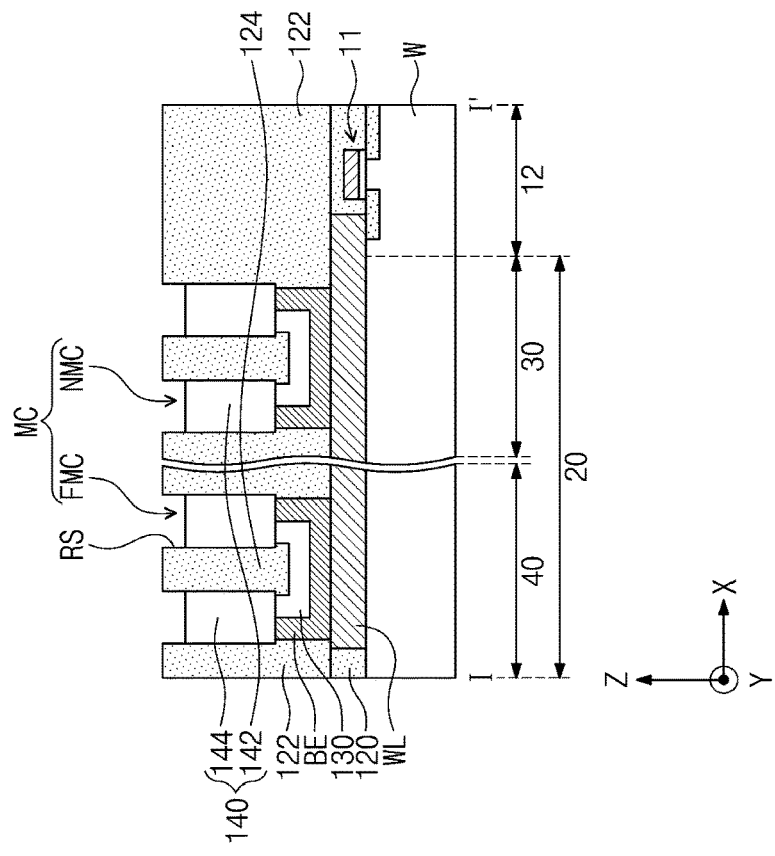

Referring to FIGS. 13A-13B and 17, portions of the first and second variable resistance elements 142 and 144 may be removed (S326). The portions of the first and second variable resistance elements 142 and 144 may be removed by an reactive ion etching process.

Figure 14A:
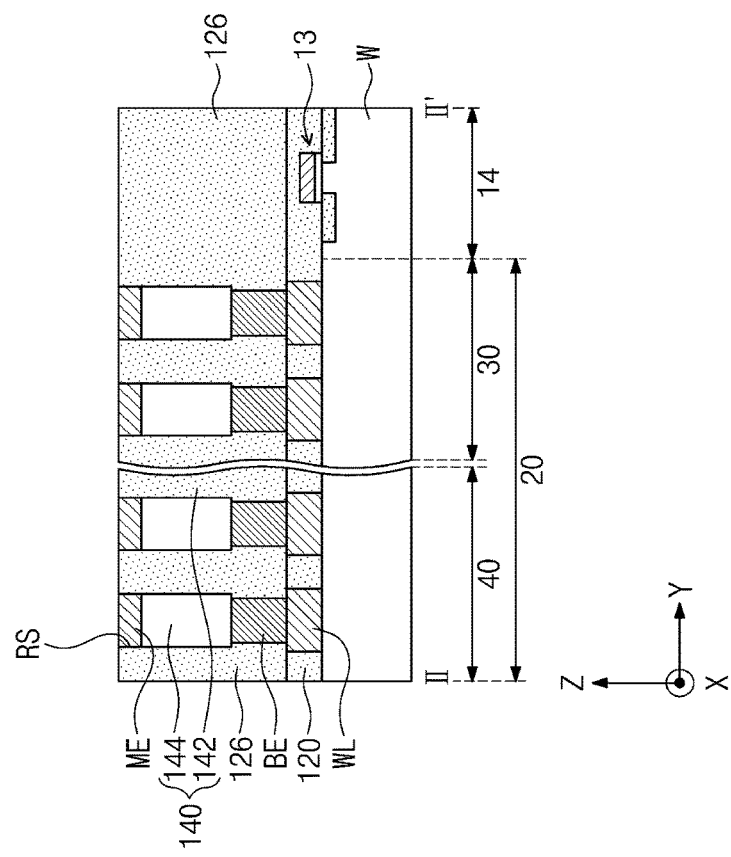
Figure 14B:
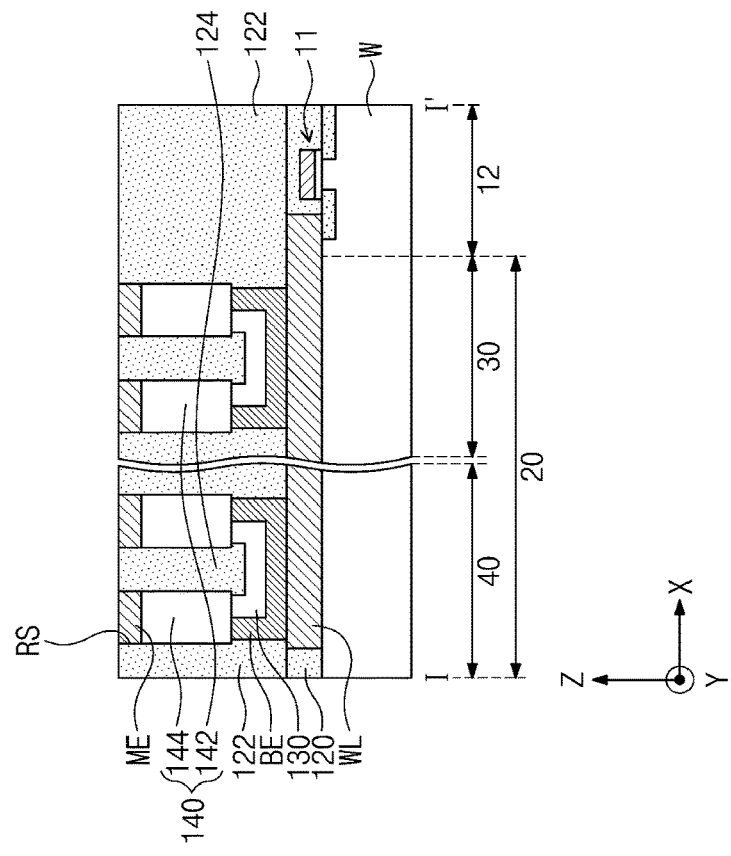

Referring to FIGS. 14A-14B and 16, the intermediate electrodes ME may be formed on the first and second variable resistance elements 142 and 144, respectively (S330). The intermediate electrodes ME may be formed by a damascene method. The intermediate electrodes ME may be formed on the first and second variable resistance elements 142 and 144 through a deposition process of a metal layer and a CMP process. For example, the intermediate electrodes ME may include at least one of W, Ti, Al, Cu, C, CN, TiN, TiAlN, TiSiN, TiCN, WN, CoSiN, WSiN, TaN, TaCN, and TaSiN.

Referring to FIGS. 15A-15B and 16, the switching element 150 and the top electrode TE may be formed on each of the intermediate electrodes ME (S340). For example, the switching elements 150 and the top electrodes TE may be formed through deposition processes of a switching layer and a metal layer, a photolithography process, and an etching process. For example, the switching layer may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe. In detail, the switching layer may be deposited on the intermediate electrodes ME and the first to third interlayer insulating layers 122, 124 and 126. The metal layer may be deposited on the switching layer. Next, photoresist patterns (not shown) may be formed on the metal layer disposed on the intermediate electrodes ME by using the photolithography process. Portions of the metal layer and the switching layer may be etched by the etching process using the photoresist patterns as etch masks, thereby forming the switching elements 150 and the top electrodes TE. Thereafter, a fourth interlayer insulating layer 128 may be formed between the switching elements 150 and between the top electrodes TE. The fourth interlayer insulating layer 128 may be formed through a deposition process of a dielectric layer and a CMP process. In addition, a contact plug 170 may be formed on the second driving unit 13. The contact plug 170 may be formed through a process of etching the third and fourth interlayer insulating layers 128 and 126, a deposition process of a metal layer, and a CMP process. The contact plug 170 may be connected to the second driving unit 13.

Referring to FIGS. 2A-2B and 7, the second lines BL may be formed on the top electrodes TE and the fourth interlayer insulating layer 128 (S400). The second lines BL may be formed through a deposition process of a metal layer, a photolithography process, and an etching process. An upper insulating layer 160 may be formed to fill spaces between the second lines BL. The upper insulating layer 160 may be formed through a deposition process of a dielectric layer and a CMP process.

Figure 18:
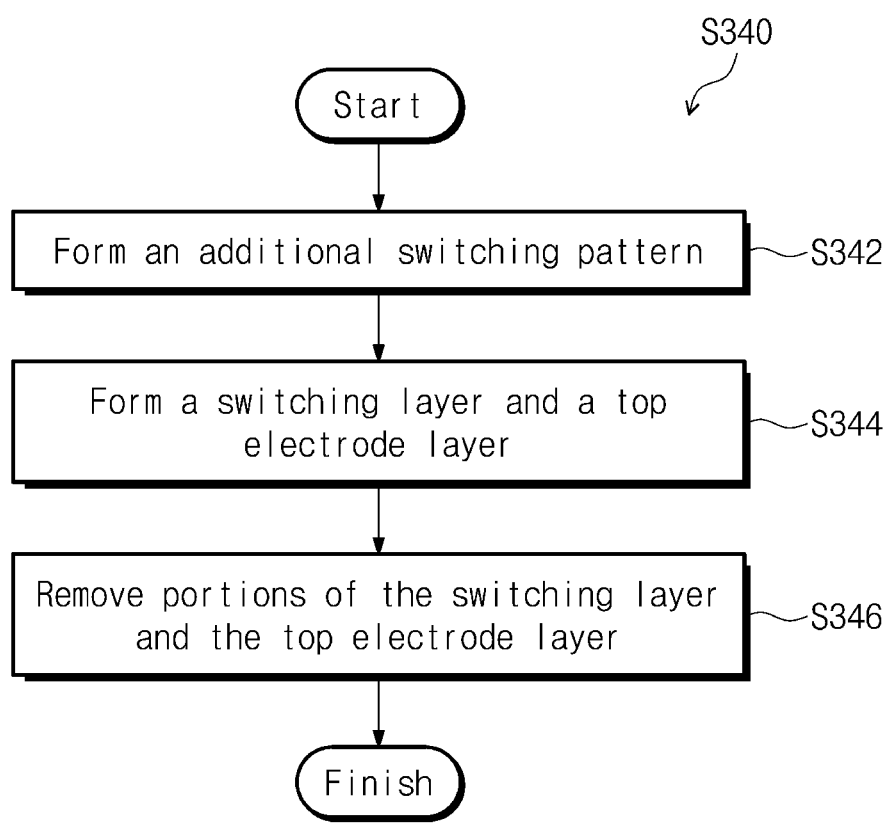
FIG. 18 is a flowchart illustrating an embodiment of a method of forming switching elements and top electrodes of FIG. 3, according to some embodiments.

FIG. 18 is a flowchart illustrating an embodiment of step S340 of forming the switching elements 150 and the top electrodes TE of FIGS. 3A-3B.

Referring to FIG. 18, step S340 of forming the switching elements 150 and the top electrodes TE may include forming a switching pattern 151 (S342), forming a switching layer 153 and a top electrode layer 155 (S344), and removing portions of the switching layer 153 and the top electrode layer 155 to form first and second switching elements 152 and 154 and first and second top electrodes TE1 and TE2 (S346).

FIGS. 19A-19B to 21A-21B are cross-sectional views illustrating a method of forming the first and second switching elements 152 and 154 and the first and second top electrodes TE1 and TE2 of FIGS. 3A-3B.

Figure 19A:
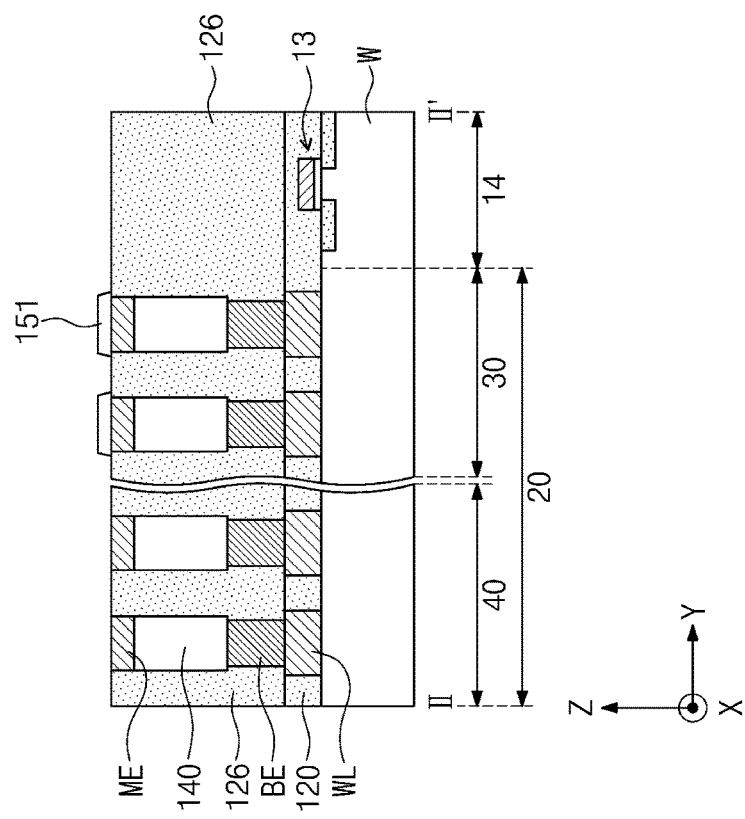
FIGS. 19A-19B to 21A-21B are cross-sectional views illustrating a method of forming first and second switching elements and first and second top electrodes of FIG. 3, respectively, according to some embodiments.
Figure 19B:
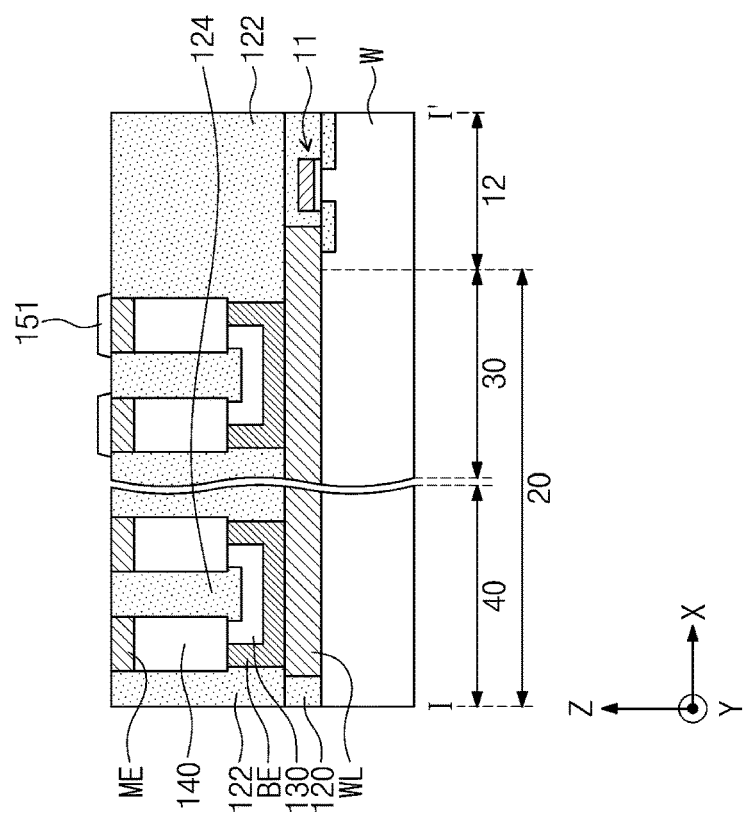

Referring to FIGS. 18 and 19A-19B, the switching pattern 151 may be formed on the near region 30 (S342). The switching pattern 151 may be formed locally on each of the intermediate electrodes ME of the near region 30. The intermediate electrodes ME of the far region 40 may be exposed. For example, the switching pattern 151 may be formed through a deposition process of a preliminary switching layer, a photolithography process, and an etching process. The preliminary switching layer may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe.

Figure 20A:
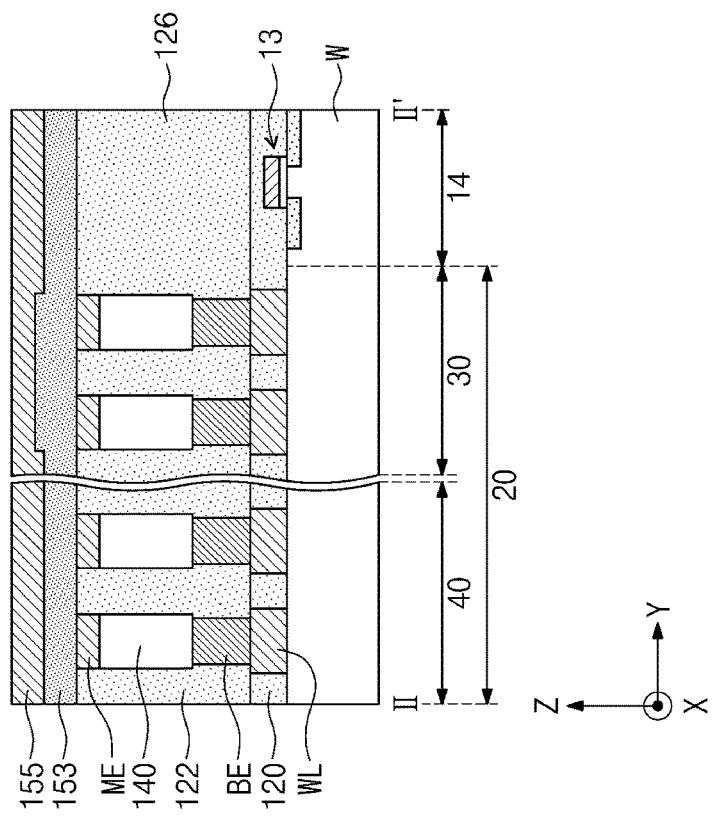
Figure 20B:
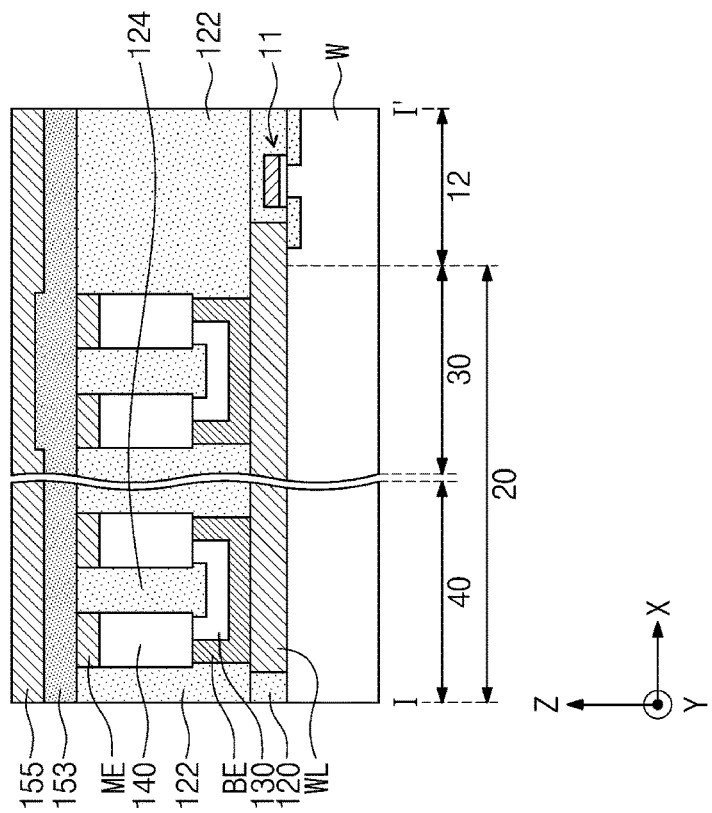

Referring to FIGS. 18 and 20A-20B, the switching layer 153 and the top electrode layer 155 may be sequentially deposited on an entire top surface of the substrate W (S344). The switching layer 153 may include the same material as the switching pattern 151. The switching layer 153 may include at least one of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, and GeAsBiSe. The top electrode layer 155 may include at least one of W, Ti, Al, Cu, C, CN, TiN, TiAlN, TiSiN, TiCN, WN, CoSiN, WSiN, TaN, TaCN, and TaSiN.

Figure 21A:
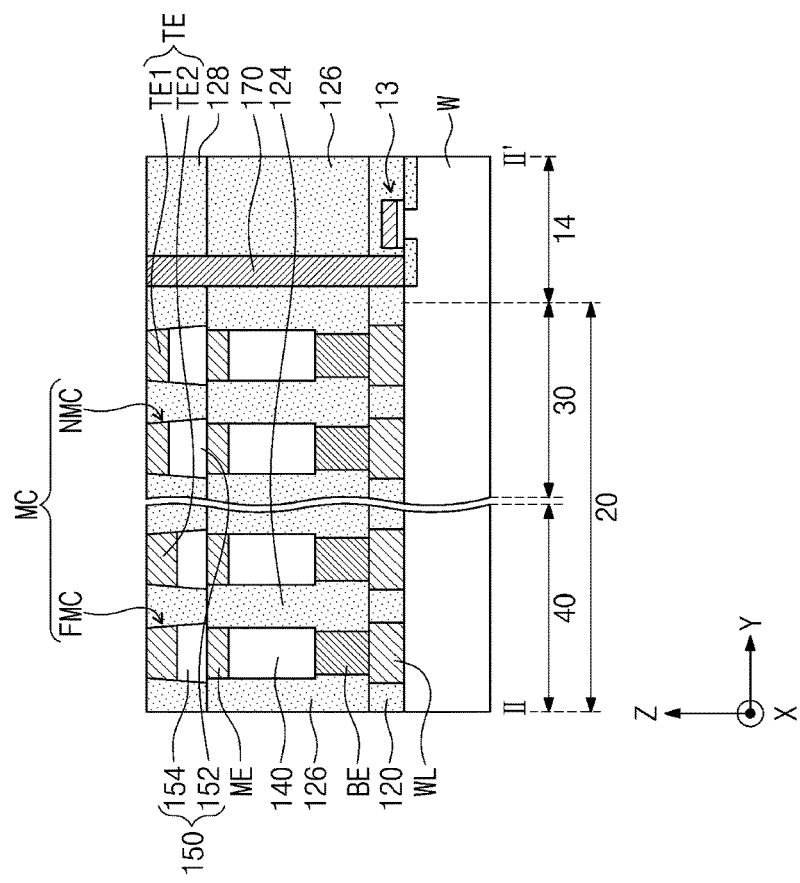
Figure 21B:
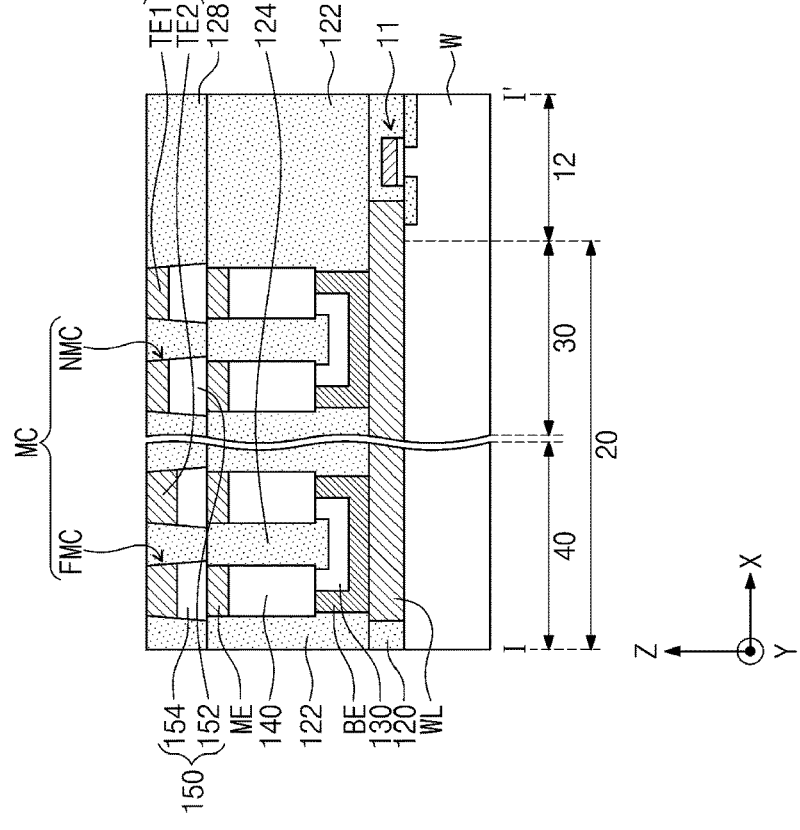

Referring to FIGS. 18 and 21A-21B, portions of the top electrode layer 155 and the switching layer 153 may be removed to form the first and second switching elements 152 and 154 and the first and second top electrodes TE1 and TE2 (S346). The first and second switching elements 152 and 154 and the first and second top electrodes TE1 and TE2 may be formed by performing the photolithography process and the etching process on the top electrode layer 155 and the switching layer 153. The first switching element 152 and the first top electrode TE1 may be formed on the near region 30, and the second switching element 154 and the second top electrode TE2 may be formed on the far region 40. The first switching element 152 and the first top electrode TE1 may be included in a near memory cell NMC, and the second switching element 154 and the second top electrode TE2 may be included in a far memory cell FMC. The first switching element 152 may be thicker than the second switching element 154.

Subsequently, a fourth interlayer insulating layer 128 may be formed between the switching elements 152 and 154 and between the top electrodes TE1 and TE2. The fourth interlayer insulating layer 128 may be formed through a deposition process of a dielectric layer and a CMP process. Thicknesses of the first and second top electrodes TE1 and TE2 on the first and second switching elements 152 and 154 may be different from each other. The first top electrode TE1 may be formed on the first switching element 152. The second top electrode TE2 may be formed on the second switching element 154. The first top electrode TE1 may be thinner than the second top electrode TE2. Thereafter, a contact hole may be formed on the second driving unit 13, and a contact plug 170 may be formed in the contact hole. The contact plug 170 may be connected to the second driving unit 13, and a top surface of the contact plug 170 may be substantially coplanar with a top surface of the fourth interlayer insulating layer 128.

Figure 22:
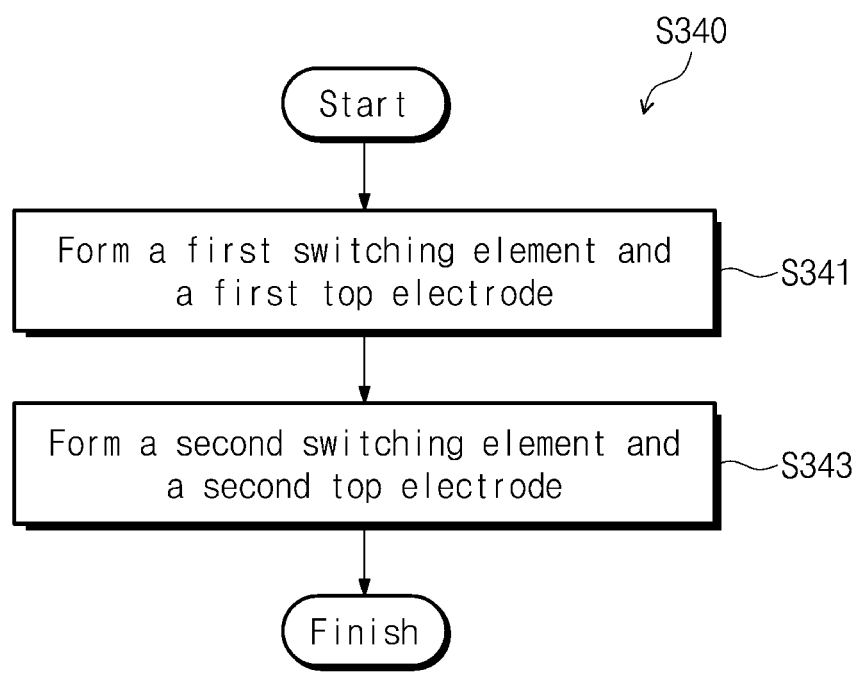
FIG. 22 is a flowchart illustrating an embodiment of a method of forming switching elements and top electrodes of FIG. 4, according to some embodiments.

FIG. 22 is a flowchart illustrating an embodiment of step S340 of forming the switching elements 150 and the top electrodes TE of FIG. 4.

Referring to FIG. 22, step S340 of forming the switching elements 150 and the top electrodes TE may include forming a first switching element 152 and a first top electrode TE1 (S341), and forming a second switching element 154 and a second top electrode TE2 (S343).

FIGS. 23A-23B and 24A-24B are cross-sectional views illustrating a method of forming the first and second switching elements 152 and 154 and the first and second top electrodes TE1 and TE2 of FIGS. 4A-4B.

Referring to FIGS. 22 and 23A-23B, the first switching element 152 and the first top electrode TE1 may be formed on the intermediate electrode ME of the near region 30 (S341). For example, step S341 of forming the first switching element 152 and the first top electrode TE1 may be included in a step of forming a near memory cell NMC. The first switching element 152 and the first top electrode TE1 may be formed through deposition processes of a first switching layer and a first top electrode layer, a photolithography process, and an etching process. The first switching layer may include AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe. The first top electrode layer may include a conductive metal.

Figure 24A:
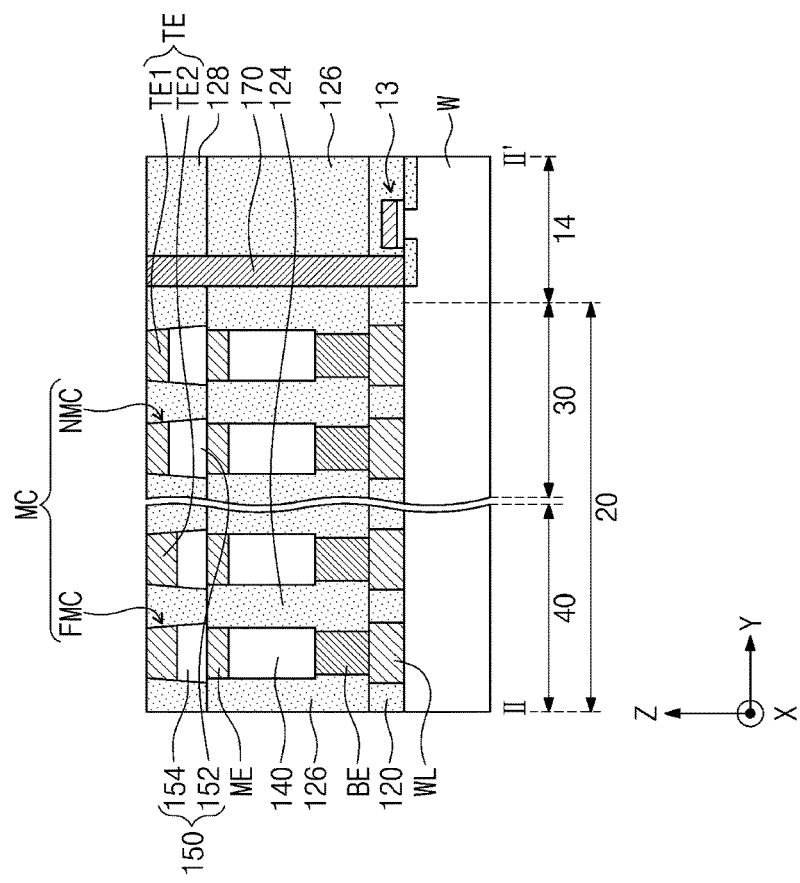
Figure 24B:
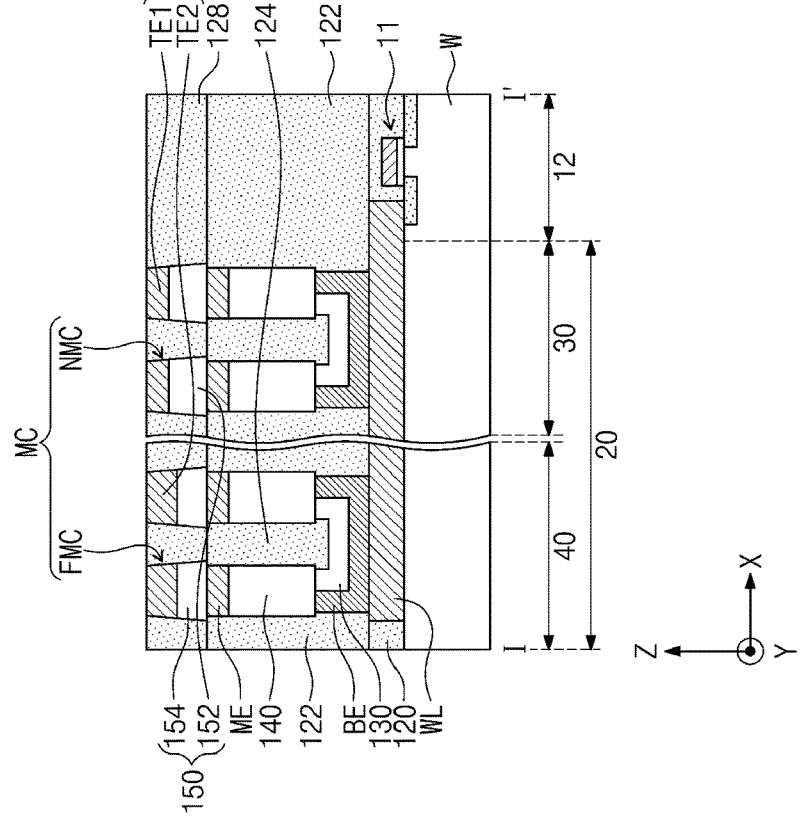

Referring to FIGS. 22 and 24A-24B, the second switching element 154 and the second top electrode TE2 may be formed on the intermediate electrode ME of the far region 40 (S343). For example, step S343 of forming the second switching element 154 and the second top electrode TE2 may be included in a step of forming a far memory cell FMC. The second switching element 154 and the second top electrode TE2 may be formed through deposition processes of a second switching layer and a second top electrode layer, a photolithography process, and an etching process. The second switching layer may be different from the first switching layer. The second switching layer may include AsTe, AsSe, SnTe, SnSe, ZnTe, ZnSe, or AsTeSe. The second top electrode layer may include a conductive metal layer.

Subsequently, a fourth interlayer insulating layer 128 may be formed between the first and second switching elements 152 and 154 and between the first and second top electrodes TE1 and TE2. Thereafter, a contact hole may be formed on the second driving unit 13, and a contact plug 170 may be formed in the contact hole. The contact plug 170 may be connected to the second driving unit 13, and a top surface of the contact plug 170 may be substantially coplanar with a top surface of the fourth interlayer insulating layer 128.

According to the embodiments, the variable resistance memory device may compensate the line resistances and/or voltage drops of the first and second lines between the memory cells and the driving units by using the difference in resistance and/or threshold voltage between the near and far memory cells, and thus, the uniformity of the driving currents and/or the driving voltages may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A variable resistance memory device comprising:
a substrate comprising a peripheral region and a core region, the core region comprising a far region spaced apart from the peripheral region, and the core region comprising a near region interposed between the far region and the peripheral region;
first conductive lines disposed on the substrate and extending in a first direction;
second conductive lines disposed on the first conductive lines and extending in a second direction; and
memory cells interposed between the first conductive lines disposed on the core region and the second conductive lines disposed on the core region, wherein the memory cells comprise:
a near memory cell disposed on the near region and controlling connection of each of the memory cells to a corresponding one of the second conductive lines; and
a far memory cell disposed on the far region,
wherein a resistance or a threshold voltage of the near memory cell is different from a resistance or a threshold voltage of the far memory cell, and
wherein the near memory cell and the far memory cell comprise a first switching element and a second switching element, respectively, having different dimensions or material characteristics.

2. The variable resistance memory device of claim 1, wherein the resistance or the threshold voltage of the near memory cell is greater than the resistance or the threshold voltage of the far memory cell.

3. The variable resistance memory device of claim 1, wherein the near memory cell and the far memory cell comprise a first variable resistance element and a second variable resistance element, respectively, and
wherein a Ge content of the first variable resistance element is higher than a Ge content of the second variable resistance element.

4. The variable resistance memory device of claim 3, wherein the first variable resistance element comprises GeTe or GeSbTe, and
wherein the second variable resistance element comprises SbTe.

5. The variable resistance memory device of claim 3, wherein a sum of resistances of the first variable resistance element and corresponding ones of the first conductive lines and the second conductive lines is substantially similar to a sum of resistances of the second variable resistance element and corresponding ones of the first conductive lines and the second conductive lines.

6. The variable resistance memory device of claim 1, wherein the first switching element is thicker than the second switching element.

7. The variable resistance memory device of claim 6, wherein the near memory cell further comprises a first top electrode interposed between the first switching element and a corresponding one of the second conductive lines,
wherein the far memory cell further comprises a second top electrode interposed between the second switching element and a corresponding one of the second conductive lines, and
wherein the first top electrode is thinner than the second top electrode.

8. The variable resistance memory device of claim 1, wherein a Ge content of the first switching element is greater than a Ge content of the second switching element.

9. The variable resistance memory device of claim 1, wherein a content of Ge, N, Si, or C in the first switching element is greater than a content of Ge, N, Si, or C in the second switching element.

10. The variable resistance memory device of claim 1, wherein the first switching element comprises AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, or GeAsBiSe, and
wherein the second switching element comprises AsTe, AsSe, SnTe, SnSe, ZnTe, ZnSe, or AsTeSe.

11. The variable resistance memory device of claim 1, wherein the core region further comprises a middle region interposed between the near region and the far region,
wherein the memory cells further comprise a middle memory cell disposed on the middle region, and
wherein a resistance or a threshold voltage of the middle memory cell is greater than the resistance or the threshold voltage of the far memory cell, and is less than the resistance or the threshold voltage of the near memory cell.

12. A variable resistance memory device comprising:
a substrate comprising a peripheral region and a core region, the core region comprising a far region spaced apart from the peripheral region, and the core region comprising a near region interposed between the far region and the peripheral region;
first conductive lines disposed on the substrate and extending in a first direction;
second conductive lines disposed on the first conductive lines and extending in a second direction; and
memory cells interposed between the first conductive lines disposed on the core region and the second conductive lines disposed on the core region,
wherein the memory cells comprise:
a near memory cell disposed on the near region and comprising a first variable resistance element and a first switching element, the first variable resistance element controlling connection of she near memory cell to a corresponding one of the second conductive lines; and
a far memory cell disposed on the far region and comprising a second variable resistance element and a second switching element, the second variable resistance element controlling connection of the far memory cell to a corresponding one of the second conductive lines,
wherein a resistance or a threshold voltage of the first variable resistance element is different from a resistance or a threshold voltage of the second variable resistance element, and
wherein the first switching element and the second switching element have different dimensions or material characteristics.

13. The variable resistance memory device of claim 12, wherein a Ge content of the first variable resistance element is higher than a Ge content of the second variable resistance element.

14. The variable resistance memory device of claim 12, wherein the first variable resistance element includes GeTe or GeSbTe, and
wherein the second variable resistance element includes SbTe.

15. The variable resistance memory device of claim 12, wherein the first switching element is thicker than the second switching element.

16. The variable resistance memory device of claim 12, wherein the near memory cell further comprises a first top electrode interposed between the first switching element and the corresponding one of the second conductive lines,
wherein the far memory cell further comprises a second top electrode interposed between the second switching element and the corresponding one of the second conductive lines, and
wherein the first top electrode is thinner than the second top electrode.

17. The variable resistance memory device of claim 12, wherein a Ge content of the first switching element is greater than a Ge content of the second switching element.

18. A variable resistance memory device comprising:
- a plurality of memory cells interposed between a first conductive line and a plurality of second conductive lines corresponding to the plurality of memory cells, respectively,
- wherein the first conductive line and the plurality of second conductive lines have line resistances that increase according to a current conduction distance from a current source,
- wherein each of the plurality of memory cells comprises:
  - a near memory cell comprising a first variable resistance element and a first switching element disposed on or beneath the first variable resistance element, the near memory cell being connected to the first conductive line and a corresponding one of the plurality of second conductive lines; and
  - a far memory cell comprising a second variable resistance element and a second switching element disposed on or beneath the second variable resistance element, the far memory cell being connected to the first conductive line and a corresponding one of the plurality of second conductive lines,
- wherein a resistance of either one or both of the first variable resistance element and the first switching element is greater than a resistance of either one or both of the second variable resistance element and the second switching element, respectively, and
- wherein the first switching element and the second switching element have different dimensions or material characteristics.

19. The variable resistance memory device of claim 18, wherein the current conduction distance from the current source to the near memory cell is shorter than to the current conduction distance from the current source to the far memory cell.

* * * * *